US010972139B1

(12) United States Patent
Luo

(10) Patent No.: US 10,972,139 B1
(45) Date of Patent: Apr. 6, 2021

(54) WIRELESS DEVICES AND SYSTEMS INCLUDING EXAMPLES OF COMPENSATING POWER AMPLIFIER NOISE WITH NEURAL NETWORKS OR RECURRENT NEURAL NETWORKS

(71) Applicant: MICRON TECHNOLOGY, INC., Boise, ID (US)

(72) Inventor: Fa-Long Luo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/849,696

(22) Filed: Apr. 15, 2020

(51) Int. Cl.
*H04B 1/04* (2006.01)
*H03F 3/20* (2006.01)
*G06N 3/04* (2006.01)

(52) U.S. Cl.
CPC ......... *H04B 1/0475* (2013.01); *G06N 3/0445* (2013.01); *H03F 3/20* (2013.01); *H03F 2200/451* (2013.01); *H04B 2001/045* (2013.01); *H04B 2001/0425* (2013.01); *H04B 2001/0433* (2013.01)

(58) Field of Classification Search
CPC .......... H04B 1/0475; H04B 2001/0425; H04B 2001/0433; H04B 2001/045; G06N 3/0445; G06N 3/02; G06N 3/08; H03F 3/20; H03F 2200/451
See application file for complete search history.

(56) References Cited

U.S. PATENT DOCUMENTS 4,885,757 A * 12/1989 Provence ................ G06J 1/005
375/343
6,054,896 A 4/2000 Wright et al.
6,967,970 B2 11/2005 Terry et al.
(Continued)

FOREIGN PATENT DOCUMENTS

KR 1020160019102 A 2/2016

OTHER PUBLICATIONS

U.S. Appl. No. 16/435,264 entitled "Wireless Devices and Systems Including Examples of Mismatch Correction Scheme"; filed Jun. 7, 2019; pp. all.
(Continued)

*Primary Examiner* — Nguyen T Vo
(74) *Attorney, Agent, or Firm* — Dorsey & Whitney LLP

(57) ABSTRACT

Examples described herein include methods, devices, and systems which may compensate input data for nonlinear power amplifier noise to generate compensated input data. In compensating the noise, during an uplink transmission time interval (TTI), a switch path is activated to provide amplified input data to a receiver stage including a recurrent neural network (RNN). The RNN may calculate an error representative of the noise based partly on the input signal to be transmitted and a feedback signal to generate filter coefficient data associated with the power amplifier noise. The feedback signal is provided, after processing through the receiver, to the RNN. During an uplink TTI, the amplified input data may also be transmitted as the RF wireless transmission via an RF antenna. During a downlink TTI, the switch path may be deactivated and the receiver stage may receive an additional RF wireless transmission to be processed in the receiver stage.

22 Claims, 17 Drawing Sheets

(56) References Cited

U.S. PATENT DOCUMENTS

| | | |
|---|---|---|
| 8,498,591 B1 | 7/2013 | Qian et al. |
| 8,699,620 B1 | 4/2014 | Wu |
| 10,097,396 B2 | 10/2018 | Sestok, IV |
| 10,116,485 B1 | 10/2018 | Liu et al. |
| 10,243,596 B1 | 3/2019 | Kerhuel et al. |
| 10,333,567 B1 * | 6/2019 | Luo .................. H04B 1/0483 |
| 10,432,240 B1 | 10/2019 | Luo et al. |
| 10,541,841 B1 | 1/2020 | Sun et al. |
| 10,763,905 B1 * | 9/2020 | Luo .................. H04L 1/0071 |
| 2004/0246048 A1 | 12/2004 | Leyorhjelm et al. |
| 2005/0105642 A1 | 5/2005 | Muller et al. |
| 2005/0113132 A1 | 5/2005 | Irsheid et al. |
| 2007/0241812 A1 | 10/2007 | Yang et al. |
| 2008/0159442 A1 | 7/2008 | Tanabe et al. |
| 2009/0072900 A1 | 3/2009 | Park et al. |
| 2009/0232191 A1 | 9/2009 | Gupta et al. |
| 2010/0277236 A1 | 11/2010 | Horiguchi et al. |
| 2010/0329387 A1 | 12/2010 | Watanabe |
| 2011/0013724 A1 | 1/2011 | Metreaud et al. |
| 2011/0051790 A1 | 3/2011 | Honda |
| 2011/0064162 A1 | 3/2011 | McCallister et al. |
| 2011/0158089 A1 | 6/2011 | Sambhwani et al. |
| 2011/0310820 A1 | 12/2011 | Liao |
| 2012/0013404 A1 | 1/2012 | Ngai |
| 2012/0155572 A1 | 6/2012 | Kim et al. |
| 2012/0250728 A1 | 10/2012 | Pischl et al. |
| 2012/0263215 A1 | 10/2012 | Peng |
| 2012/0321018 A1 | 12/2012 | Chen et al. |
| 2013/0002357 A1 | 1/2013 | Thomsen et al. |
| 2013/0039229 A1 | 2/2013 | Park et al. |
| 2013/0094550 A1 | 4/2013 | Coan et al. |
| 2013/0142284 A1 | 6/2013 | Asensio et al. |
| 2014/0086356 A1 | 3/2014 | Azadet et al. |
| 2014/0086361 A1 | 3/2014 | Azadet et al. |
| 2014/0155006 A1 | 6/2014 | Matsuura |
| 2015/0030103 A1 | 1/2015 | Hormis et al. |
| 2015/0146584 A1 | 5/2015 | Wang et al. |
| 2015/0195050 A1 | 7/2015 | Kim et al. |
| 2015/0303984 A1 | 10/2015 | Braithwaite |
| 2016/0094318 A1 | 3/2016 | Shattil |
| 2016/0094895 A1 | 3/2016 | Stadelmeier et al. |
| 2017/0055264 A1 | 2/2017 | Seo et al. |
| 2017/0078054 A1 | 3/2017 | Hadani et al. |
| 2017/0222687 A1 | 8/2017 | Wyville |
| 2017/0279479 A1 | 9/2017 | Adams et al. |
| 2017/0302482 A1 | 10/2017 | Pathikulangara et al. |
| 2017/0346509 A1 | 11/2017 | Sulimarski et al. |
| 2018/0123622 A1 | 5/2018 | Tan et al. |
| 2018/0248741 A1 | 8/2018 | Petrovic |
| 2018/0255518 A1 | 9/2018 | Nammi et al. |
| 2019/0363743 A1 | 11/2019 | Luo et al. |
| 2020/0243102 A1 * | 7/2020 | Schmidt ................ G10L 19/005 |

OTHER PUBLICATIONS

PCT Patent Application No. PCT/US19/33459 titled "Wireless Devices and Systems Including Examples of Compensating Power Amplifier Noise" filed May 22, 2019; pp. all.

U.S. Appl. No. 15/986,555, titled "Wireless Devices and Systems Including Examples of Compensating Power Amplifier Noise", filed May 22, 2018, pp. all.

U.S. Appl. No. 16/118,017, titled "Wireless Devices and Systems Including Examples of Compensating Power Amplifier Noise", filed Aug. 30, 2018, pp. all.

U.S. Appl. No. 16/935,699, titled "Wireless Devices and Systems Including Examples of Mismatch Correction Scheme", dated Jul. 22, 2020, pp. all.

U.S. Appl. No. 16/992,486 titled "Wireless Devices and Systems Including Examples of Compensating I/Q Imbalance With Neural Networks or Recurrent Neural Networks", filed Aug. 13, 2020, pp. all.

U.S. Appl. No. 17/162,992 titled "Wireless Devices and Systems Including Examples of Compensating Power Amplifier Noise" filed Jan. 29, 2021, pp. all.

\* cited by examiner

WIRELESS DEVICES AND SYSTEMS INCLUDING EXAMPLES OF COMPENSATING POWER AMPLIFIER NOISE WITH NEURAL NETWORKS OR RECURRENT NEURAL NETWORKS

BACKGROUND

Digital signal processing for wireless communications, such as digital baseband processing or digital front-end implementations, may be implemented using hardware (e.g. silicon) computing platforms. For example, multimedia processing and digital radio frequency (RF) processing may be accomplished by an application-specific integrated circuit (ASIC) which may implement a digital front-end for a wireless transceiver. A variety of hardware platforms are available to implement digital signal processing, such as the ASIC, a digital signal processor (DSP) implemented as part of a field-programmable gate array (FPGA), or a system-on-chip (SoC). However, each of these solutions often requires implementing customized signal processing methods that are hardware-implementation specific. For example, a digital signal processor may implement a specific portion of digital processing at a cellular base station, such as filtering interference based on the environmental parameters at that base station. Each portion of the overall signal processing performed may be implemented by different, specially-designed hardware, creating complexity.

Moreover, there is an increasing interest in moving wireless communications to "fifth generation" (5G) systems. 5G offers promise of increased speed and ubiquity, but methodologies for processing 5G wireless communications have not yet been set. In some implementations of 5G wireless communications, "Internet of Things" (IoT) devices may operate on a narrowband wireless communication standard, which may be referred to as Narrow Band IoT (NB-IoT). For example, Release 13 of the 3GPP specification describes a narrowband wireless communication standard.

Additionally, machine learning (ML) and artificial intelligence (AI) techniques are in need of higher capacity and widely connected infrastructures to train devices that use such techniques. For example, machine learning generally refers to a type of AI that may use data sets, often a large volume of data, to train machines on statistical methods of analysis. And there is need for higher-capacity memory and multichip packages to facilitate AI training and inference engines, whether in the cloud or embedded in mobile and edge devices. For example, large volumes of data are needed in real time to train AI systems and accelerate inference. Additionally, there is a need for communication capacity at mobile or sensor devices at the edge network, for example, to facilitate processing of data acquired at the edge network, e.g., to efficiently offload such data to a data center for AI or ML techniques to be applied.

DETAILED DESCRIPTION

Figure 1:
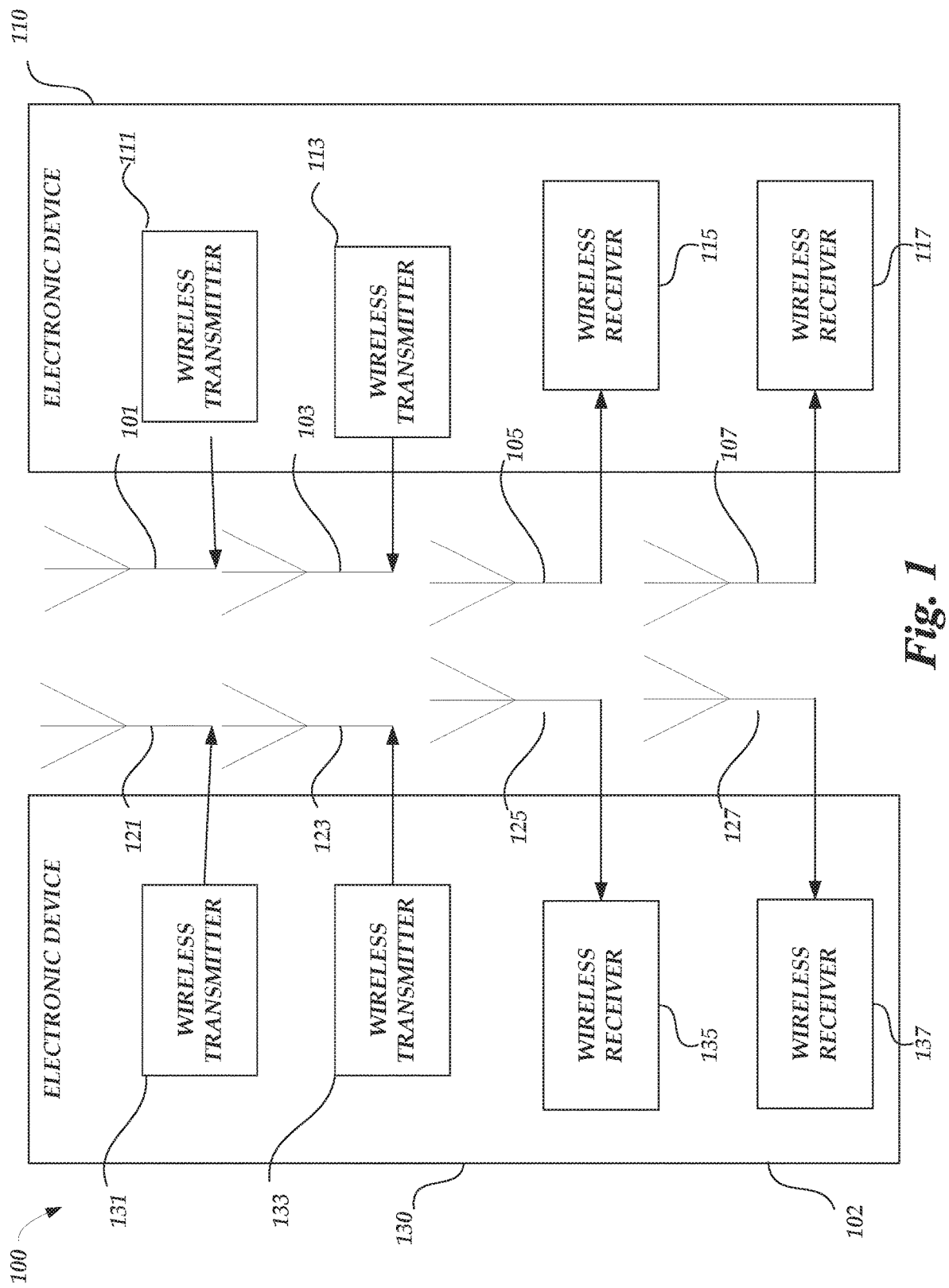
FIG. 1 is a schematic illustration of a system arranged in accordance with examples described herein.

Examples described herein include wireless devices and systems which may include examples of compensating power amplifier noise. Digital pre-distortion (DPD) filters may be utilized to compensate nonlinear power amplifier noise, such as power amplifier noise found in wireless devices and systems with power amplifiers. For example, an RF power amplifier (PA) may be utilized in transmitters of wireless devices and systems to amplify wireless transmission signals that are to be transmitted. Such nonlinear power amplifier noise from power amplifiers may be difficult to model, and, accordingly, DPD filters are utilized to compensate such nonlinear power amplifier noise, thereby reducing noises introduced into the wireless transmission signal from a power amplifier during transmission. Conventional wireless devices and systems may utilize specially-designed hardware to implement a DPD filter in a wireless device or system. For example, a DPD filter may be implemented in a variety of hardware platforms, as part of a wireless transceiver or transmitter.

As described herein, a recurrent neural network (RNN) in a wireless device or system may utilize feedback after processing of a compensated wireless transmission signal to determine how efficiently the DPD filter is compensating such wireless transmission signals. For example, in determining how efficiently the DPD filter is performing compensation for nonlinear power amplifier noise, the recurrent neural network may calculate an error signal between an initial wireless transmission signal and the compensated, amplified wireless transmission signal to reduce error in a model of the DPD filter (e.g., filter coefficient data utilized to model a compensation filter). Conventional wireless devices may include a specific path with a receiver portion to process a feedback signal at a DPD filter, which may be inefficient in utilizing computational resources and/or board space to provide such a path for the feedback. That specific path with the receiver portion to process the feedback signal may be in addition to a wireless receiver path for a wireless receiver portion of the wireless device. Accordingly, chip architectures in which the feedback signal is provided to a recurrent neural network in an efficient scheme may be desired to reduce computational resources needed and/or optimize the board space of that wireless chip.

In the examples described herein, a time division duplexing (TDD) configured radio frame is utilized in conjunction with a single receiver path to provide both a feedback signal to a recurrent neural network and to receive wireless transmission signals, which may be received at a wireless receiver portion of a wireless device. In accordance with the examples described herein, a switch may activate a path to provide the feedback signal through the wireless receiver path to the recurrent neural network, when the wireless receiver path is not receiving an active wireless signal. For example, the wireless receiver path may not receive an active wireless signal during an uplink time period of a TDD configured radio frame. The uplink time period of the TDD configured radio frame can be referred to as an uplink transmission time interval (TTI). Similarly, the downlink time period of the TDD configured radio frame can be referred to as a downlink transmission time interval (TTI). During an uplink TTI, the switch may be activated to provide the feedback through the wireless receiver path to the recurrent neural network. In providing the feedback over multiple uplink TTIs, the recurrent neural network may provide the filter coefficient data of a model, which compensates for nonlinear power amplifier noise, as implemented in a DPD filter. For example, radio frequency (RF) signals to be transmitted may be processed by the DPD filter in accordance with the filter coefficient data, prior to an input of those signals to a power amplifier. Advantageously, in using the provided filter coefficient data, the DPD filter may compensate for nonlinear power amplifier noise introduced by a power amplifier when those RF signals are amplified by the power amplifier.

Additionally, during downlink TTIs, the switch may deactivate the path that provides feedback through the wireless receiver path, so that the wireless receiver portion of a wireless transceiver may receive wireless transmission signals, thereby providing for efficient TDD frames to both provide the feedback signal to the recurrent neural network and to receive wireless signals using the same wireless receiver path.

Examples described herein additionally include systems and methods which include wireless devices and systems with examples of mixing input data with pluralities of coefficients in multiple layers of multiplication/accumulation units (MAC units) and corresponding memory look-up units (MLUs). For example, a number of layers of MAC units may correspond to a number of wireless channels, such as a number of channels received at respective antennas of a plurality of antennas. In addition, a number of MAC units and MLUs utilized is associated with the number of channels. For example, a second layer of MAC units and MLUs may include a number, such as m−1, MAC units and MLUs, where m represents the number of antennas, each antenna receiving a portion of input data. Advantageously, in utilizing such a hardware framework, the processing capability of generated output data may be maintained while reducing a number of MAC units and MLUs, which are utilized for such processing in an electronic device. In some examples, however, where board space may be available, a hardware framework may be utilized that includes m MAC units and m MLUs in each layer, where m represents the number of antennas.

Multi-layer neural networks (NNs) and/or multi-layer recurrent neural networks (RNNs) may be used to determine and provide filter coefficient data. Accordingly, a wireless device or system that implements a NN or RNN, as described herein, may compensate for such nonlinear power amplifier noise. The NNs and/or RNNs may have nonlinear mapping and distributed processing capabilities which may be advantageous in many wireless systems, such as those involved in processing wireless input data having time-varying wireless channels (e.g., autonomous vehicular networks, drone networks, or Internet-of-Things (IoT) networks).

FIG. 1 is a schematic illustration of a system 100 arranged in accordance with examples described herein. System 100 includes electronic device 102, electronic device 110, antenna 101, antenna 103, antenna 105, antenna 107, antenna 121, antenna 123, antenna 125, antenna 127, wireless transmitter 111, wireless transmitter 113, wireless receiver 115, wireless receiver 117, wireless transmitter 131, wireless transmitter 133, wireless receiver 135 and, wireless receiver 137. The electronic device 102 may include antenna 121, antenna 123, antenna 125, antenna 127, wireless transmitter 131, wireless transmitter 133, wireless receiver 135, and wireless receiver 137. The electronic device 110 may include antenna 101, antenna 103, antenna 105, antenna 107, wireless transmitter 111, wireless transmitter 113, wireless receiver 115, and wireless receiver 117. In operation, electronic devices 102, 110 can communicate wireless communication signals between the respective antennas of each electronic device. In an example of a TDD mode, wireless transmitter 131 coupled to antenna 121 may transmit to antenna 105 coupled to wireless receiver 115 during an uplink period of the TDD configured radio frame, while, at the same time or during at least a portion of the same time, the wireless transmitter may also activate a switch path that provides a feedback signal to a recurrent neural network of wireless transmitter 131.

The recurrent neural network of wireless transmitter 131 may provide the filter coefficient data that are utilized in a model to at least partially compensate for power amplifier noise internal to the wireless transmitter 131. The wireless transmitter 131 may include a power amplifier that amplifies wireless transmission signals before providing such respective wireless transmission signals to the antenna 121 for RF transmission. In some examples, the recurrent neural network of the wireless transmitter 131 may also provide (e.g., optimize) filter coefficient data to also at least partially compensate power amplifier noise from other components of the electronic device 102, such as a power amplifier of the wireless transmitter 133. After an uplink period of a time division duplexing (TDD) configured radio frame has passed, the wireless receiver 135 and/or the wireless receiver 137 may receive wireless signals during a downlink period of the time division duplexing configured radio frame. For example, the wireless receiver 135 and/or the wireless receiver 137 may receive individual signals or a combination of signals (e.g., a MIMO signal) from the electronic device 110, having transmitted wireless signals from the wireless transmitter 111 coupled to the antenna 101 and/or from the wireless transmitter 113 coupled to the antenna 103. Power amplifier noise may generally refer to any noise in a signal to be transmitted from an electronic device that may be at least partially generated by one or more power amplifiers of that electronic device.

Electronic devices described herein, such as electronic device 102 and electronic device 110 shown in FIG. 1 may be implemented using generally any electronic device for which communication capability is desired. For example, electronic device 102 and/or electronic device 110 may be implemented using a mobile phone, smartwatch, computer (e.g. server, laptop, tablet, desktop), or radio. In some examples, the electronic device 102 and/or electronic device 110 may be incorporated into and/or in communication with other apparatuses for which communication capability is desired, such as but not limited to, a wearable device, a medical device, an automobile, airplane, helicopter, appliance, tag, camera, or other device.

While not explicitly shown in FIG. 1, electronic device 102 and/or electronic device 110 may include any of a variety of components in some examples, including, but not limited to, memory, input/output devices, circuitry, processing units (e.g. processing elements and/or processors), or combinations thereof.

The electronic device 102 and the electronic device 110 may each include multiple antennas. For example, the electronic device 102 and electronic device 110 may each have more than two antennas. Three antennas each are shown in FIG. 1, but generally any number of antennas may be used including 2, 3, 4, 5, 6, 7, 8, 9, 10, 11, 12, 13, 14, 15, 16, 32, or 64 antennas. Other numbers of antennas may be used in other examples. In some examples, the electronic device 102 and electronic device 110 may have a same number of antennas, as shown in FIG. 1. In other examples, the electronic device 102 and electronic device 110 may have different numbers of antennas. Generally, systems described herein may include multiple-input, multiple-output ("MIMO") systems. MIMO systems generally refer to systems including one or more electronic devices which transmit transmissions using multiple antennas and one or more electronic devices which receive transmissions using multiple antennas. In some examples, electronic devices may both transmit and receive transmissions using multiple antennas. Some example systems described herein may be "massive MIMO" systems. Generally, massive MIMO systems refer to systems employing greater than a certain number (e.g. 64) antennas to transmit and/or receive transmissions. As the number of antennas increase, so to generally does the complexity involved in accurately transmitting and/or receiving transmissions.

Although two electronic devices (e.g. electronic device 102 and electronic device 110) are shown in FIG. 1, generally the system 100 may include any number of electronic devices.

Electronic devices described herein may include receivers, transmitters, and/or transceivers. For example, the electronic device 102 of FIG. 1 includes wireless transmitter 131 and wireless receiver 135, and the electronic device 110 includes wireless transmitter 111 and wireless receiver 115. Generally, receivers may be provided for receiving transmissions from one or more connected antennas, transmitters may be provided for transmitting transmissions from one or more connected antennas, and transceivers may be provided for receiving and transmitting transmissions from one or more connected antennas. While both electronic devices 102, 110 are depicted in FIG. 1 with individual wireless transmitter and individual wireless receivers, it can be appreciated that a wireless transceiver may be coupled to antennas of the electronic device and operate as either a wireless transmitter or wireless receiver, to receive and transmit transmissions. For example, a transceiver of electronic device 102 may be used to provide transmissions to and/or receive transmissions from antenna 121, while other transceivers of electronic device 110 may be provided to provide transmissions to and/or receive transmissions from antenna 101 and antenna 103. Generally, multiple receivers, transmitters, and/or transceivers may be provided in an electronic device—one in communication with each of the antennas of the electronic device. The transmissions may be in accordance with any of a variety of protocols, including, but not limited to 5G signals, and/or a variety of modulation/demodulation schemes may be used, including, but not limited to: orthogonal frequency division multiplexing (OFDM), filter bank multi-carrier (FBMC), the generalized frequency division multiplexing (GFDM), universal filtered multi-carrier (UFMC) transmission, bi orthogonal frequency division multiplexing (BFDM), sparse code multiple access (SCMA), non-orthogonal multiple access (NOMA), multi-user shared access (MUSA) and faster-than-Nyquist (FTN) signaling with time-frequency packing. In some examples, the transmissions may be sent, received, or both, in accordance with 5G protocols and/or standards.

Examples of transmitters, receivers, and/or transceivers described herein, such as the wireless transmitter 131 and the wireless transmitter 111 may be implemented using a variety of components, including, hardware, software, firmware, or combinations thereof. For example, transceivers, transmitters, or receivers may include circuitry and/or one or more processing units (e.g. processors) and memory encoded with executable instructions for causing the transceiver to perform one or more functions described herein (e.g. software).

Figure 2:
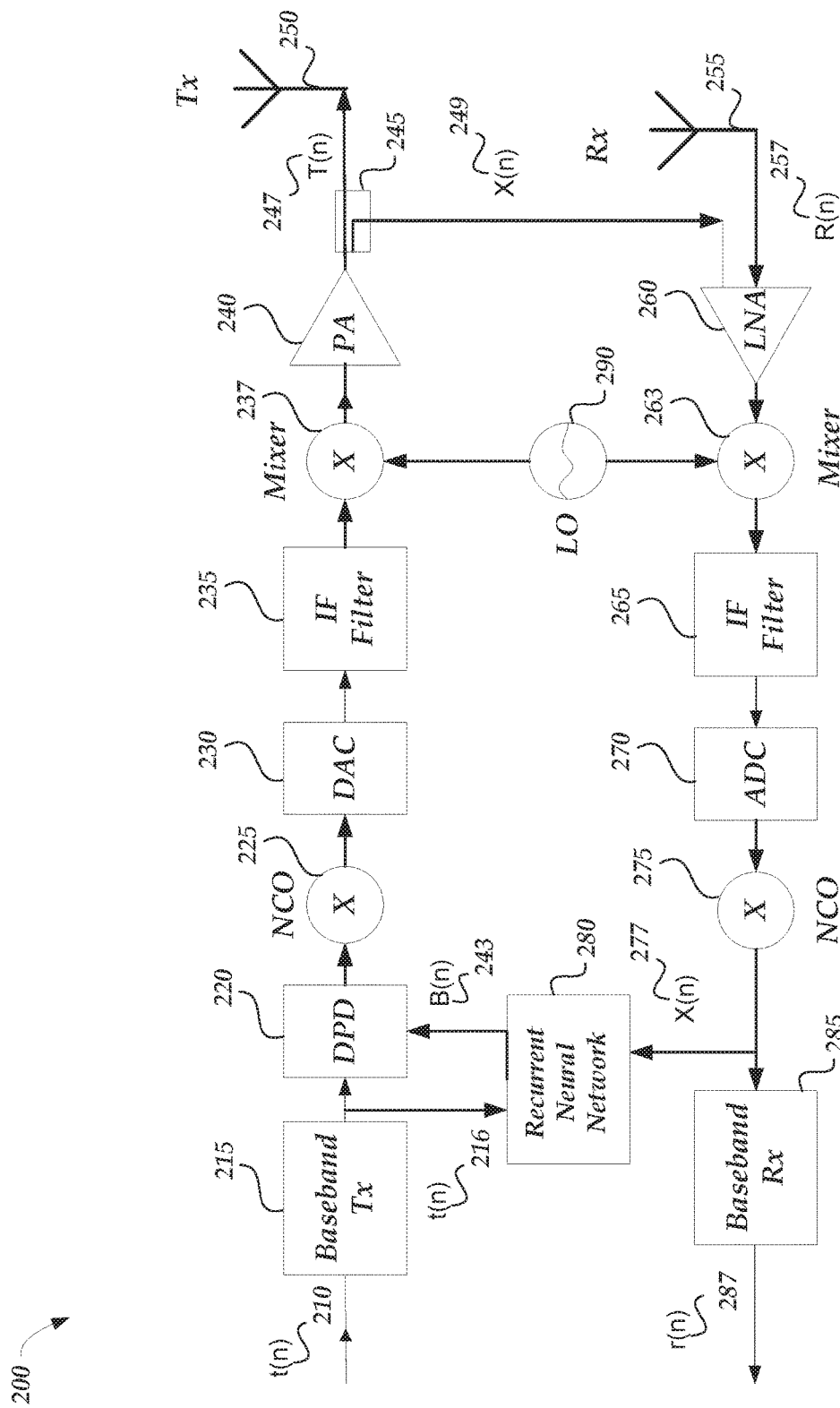
FIG. 2 is a schematic illustration of an electronic device arranged in accordance with examples described herein.

FIG. 2 is a schematic illustration of an electronic device 200 arranged in accordance with examples described herein. Electronic device 200 includes a baseband transmitter (Tx) 215 and a baseband receiver (Rx) 285, each respectively having a transmitter path and a receiver path to/from transmitting antenna (Tx) 250 and receiving antenna (Rx) 255. Electronic device 200 may represent an implementation of the electronic device 102, 110; with the baseband transmitter 215 and transmitter path representing a wireless transmitter 131, 133 or wireless transmitter 111, 113; and with the baseband receiver 285 representing a wireless receiver 135, 137 or wireless receiver 115, 117.

After having received a signal to be transmitted t(n) 210, the baseband transmitter 215 may perform baseband processing on that signal to be transmitted t(n) 210 to generate a baseband signal to be transmitted t(n) 216. The signal 216 is provided to the recurrent neural network 280 and also provided, along the transmitter path towards the transmitting antenna 250, to a digital pre-distortion (DPD) filter 220. The DPD filter 220 at least partially compensates the signal t(n) 216 based on a model including filter coefficient data provided to the DPD filter by the recurrent neural network 280. The DPD filter 220 utilizes the model based on the filter coefficient data to at least partially compensate the signal 216 for noise in the electronic device 200, such as nonlinear power amplifier noise generated by the power amplifier 240. As will be described with respect to the recurrent neural network 280, the filter coefficient data may be determined to reduce the error introduced into the signal to be transmitted t(n) 216 by nonlinear power amplifier noise, when that signal 216 is amplified by power amplifier 240 for transmission at the transmitting antenna 250. The DPD filter 220 utilizes the provided filter coefficient data to wholly and/or partially compensate for nonlinear power amplifier noise introduced by the power amplifier 240, e.g., prior to input of additional input signals to be provided to the power amplifier 240. While referred to as the DPD filter 220, it can be appreciated that various digital filters may implement the DPD filter 220, and thus the DPD filter 220 may also be referred to as a digital filter.

After having been at least partially compensated for noise by the DPD filter 220, the signal to be transmitted t(n) may be further processed along the transmitter path towards the transmitting antenna 250. Accordingly, the compensated signal 216 is processed by the numerically controlled oscillator (NCO) 225, the digital to analog converter 230, the intermediate frequency (IF) filter 235, the mixer 237 in conjunction with a provided local oscillating signal from the local oscillator 290, and the power amplifier 240 to generate amplified signal to be transmitted T(n) 247. The signal to be transmitted T(n) 247 is provided to the transmitting antenna 250 via a switch 245. The transmitter path to the transmitting antenna 250 includes a path through the switch 245 for transmission of any signal to be transmitted. That same amplified signal to be transmitted T(n) 247 is provided to the receiver path via the switch 245, when the switch 245 is activated, as the signal X(n) 249.

The switch 245 may be activated by a control signal (e.g., a selection signal) that indicates an uplink (TTI) is occurring in a time division duplexing configured radio frame that the electronic device 200 utilizes. When the switch 245 is activated, the amplified signal to be transmitted T(n) 247 is provided to the receiver path of the electronic device 200 to be used as a feedback signal in calculations performed by the recurrent neural network 280. The amplified signal to be transmitted T(n) 247 is provided to the receiver path as the signal X(n) 249, starting at the low noise amplifier (LNA) 260. The signal X(n) 249 and the amplified signal to be transmitted T(n) 247 represent the same signal processed by the power amplifier 240. The signal X(n) 249 and the amplified signal to be transmitted T(n) 247 are both provided by the switch 245, when the switch 245 is activated, to the receiver path of the electronic device 200 and the transmitting antenna 250, respectively. Accordingly, the signal X(n) 249 is processed by the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to generate the feedback signal X(n) 277 that is provided to the recurrent neural network 280. The recurrent neural network 280 may also receive the control signal indicating that an uplink time period is occurring, and may receive the feedback signal X(n) 277 to process that signal in a calculation to reduce the error introduced by the nonlinear power amplifier noise generated by the power amplifier 240.

After receiving the feedback signal X(n) 277, the recurrent neural network 280 may determine to calculate an error signal between the signal to be transmitted t(n) 216 and the compensated wireless transition signal to reduce error in a model of the DPD filter 220. The recurrent neural network utilizes the error signal to determine and/or update filter coefficient data B(n) 243 provided to the DPD filter 220 for utilization in a model of the DPD filter 220 that at least partially compensates nonlinear power amplifier noise. For the recurrent neural network 280 to calculate the filter coefficient data to be utilized in the DPD filter 220, the recurrent neural network 280 may compute an error signal for reducing a difference between the signal to be transmitted t(n) 216 that is input to the DPD filter 220 and the feedback signal X(n) 277. For example, the difference may be reduced (e.g., minimized) by utilizing Equation (1):

$$z(k) = \left[1 + \sum_{p=2}^{P} \sum_{m=-M}^{M} a_{p,m} \cdot |y(k-m)|^{p-1}\right] \cdot y(k) \quad (1)$$

The signal to be transmitted t(n) 216 may be calculated in Equation (1) as z(k). The feedback signal X(n) 277 may be calculated in Equation (1) as y(k), to be summed over 'p' and 'm,' where 'P' represents the nonlinear order of the power amplifier noise to be compensated and 'M' represents a "memory" of the recurrent neural network 280. For example, the recurrent neural network may store previous versions of the feedback signal X(n) 277, with the 'm' term representative of an offset of the feedback signal X(n) 277, such that the offset indicates a number of time periods between a received feedback signal X(n) 277 and a previous version of the feedback signal X(n) 277, received at 'm' time periods before the feedback signal X(n) 277 had been received at the recurrent neural network 280 to perform the calculation. In the example, 'P' may represent the number of filter taps for a model of the DPD filter 220 to at least partially compensate a nonlinearity of the power amplifier noise. In various implementations, 'P' may equal 1, 2, 3, 4, 7, 9, 10, 12, 16, 20, 100, or 200. Additionally or alternatively, 'M' may equal 0, 1, 2, 3, 4, 7, 9, 10, 12, 16, 20, 100, or 200. The recurrent neural network 280 may utilize Equation (1) in conjunction with an algorithm to reduce (e.g., minimize) the difference between z(k) and y(k), such as least-mean-squares (LMS) algorithm, least-squares (LS) algorithm, or total-least-squares (TLS) algorithm. Accordingly, in reducing the difference between z(k) and y(k), the recurrent neural network determines the filter coefficient data B(n) 243, as the terms $a_{p,m}$ in Equation 1, to be utilized in the DPD filter 220. In some implementations, sample vectors may be utilized, instead of the signal to be transmitted t(n) 216, to determine an initial set of the filter coefficient data B(n) 243.

In some examples, the recurrent neural network determines and provides the filter coefficient data B(n) 243 to be utilized in the DPD filter 220 as a "memoryless" system in which the filter coefficient data B(n) 243 updates the DPD filter 220 with new filter coefficient data, replacing any filter coefficient data that the DPD filter utilized before receiving the filter coefficient data B(n) 243. Updating the DPD filter 220 with the filter coefficient data B(n) 243 may be referred to as optimizing the filter coefficient data, with some or all of the filter coefficient data being updated. For example, Equation (1) may be reduced to Equation (2) when other versions of the feedback signal X(n) 277 are not utilized in the calculation, thereby reduced the 'm' term to zero, such that Equation (1) reduces to Equation (2):

$$z(k) = \left[1 + \sum_{p=2}^{P} a_p \cdot |y(k)|^{p-1}\right] \cdot y(k) \quad (2)$$

In utilizing the same receiver path for processing of a received signal and the aforementioned generation of a feedback signal, the electronic device 200 may utilize board space and/or resources on a circuit implementing the electronic device 200, as compared to an electronic device that includes a separate path for the feedback signal and a separate path for processing of a received signal. For example, electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 for both generation of a feedback signal X(n) 277 and for processing of a received signal R(n) 257. As described, when the switch 245 is activated, the electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to generate a feedback signal X(n) 277 and calculates filter coefficient data with the recurrent neural network 280. When the switch 245 is deactivated, the electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to receive and process the received signal R(n) 257.

The switch 245 may be deactivated at the end of activation period. For example, the control signal that activates the switch 245 may include information that specifies how long the switch 245 is to be activated, e.g., an activation period. The activation period may be the same as an uplink TTI of a time-division duplexing configured radio frame that the electronic device 200 utilizes. For example, as described with reference to FIG. 6, the activation period may be a specific uplink TTI that operates at a different time period than a downlink TTI. In some examples, the switch 245 may be activated for the length of the signal 216, which may be the same length as the signal 210. Additionally or alternatively, the switch 245 may be deactivated when a wireless signal is detected at the receiving antenna 255. For example, a control signal may indicate the start of a downlink TTI when a signal is detected at the receiving antenna 255, which indicates that the activation period has finished. Accordingly, the switch 245 may deactivated.

The switch 245 may be deactivated by a control signal that indicates a downlink TTI is occurring in a time division duplexing configured radio frame that the electronic device 200 utilizes. Accordingly, a signal X(n) 249 is not provided to the receiver path of the electronic device 200 because the switch 245 is deactivated. With the switch 245 deactivated, the received signal R(n) 257 is provided to the receiver path of the electronic device 200 to processed in the receiver path for the generation of a baseband received signal r(n) 287. The received signal R(n) 257 is provided to the receiver path, starting at the low noise amplifier (LNA) 260. Accordingly, the received signal R(n) 257 is processed by the LNA 260, the mixer 263 in conjunction with the provided local oscillating signal from the local oscillator 290, the intermediate frequency (IF) filter 265, the analog-to-digital converter 270, the numerically controlled oscillator (NCO) 275, and the baseband receiver 285 to generate the baseband received signal 287. In generating the baseband received signal 287, the electronic device 200 utilizes the same receiver path that is utilized to generate and provide a feedback signal to the recurrent neural network 280, thereby efficiently utilizing the computational resources and/or board space of the electronic device 200. Accordingly, the same receiver path of electronic device 200 is utilized for the receiving wireless signals during downlink time periods and providing feedback signals to the recurrent neural network during uplink time periods. In some examples, the recurrent neural network 280, while not being provided a feedback signal X(n) 277 during the downlink time period, may calculate and/or determine filter coefficient data while the received signal R(n) 257 is being processed. Accordingly, in conjunction with time division duplexing configured radio frames, the electronic device 200 utilizes a single receiver path to provide both the feedback signal X(n) 277 to the recurrent neural network 280 and to receive wireless transmission signals, such as the received signal R(n) 257 to provide baseband received signals r(n) 287.

Figure 3:
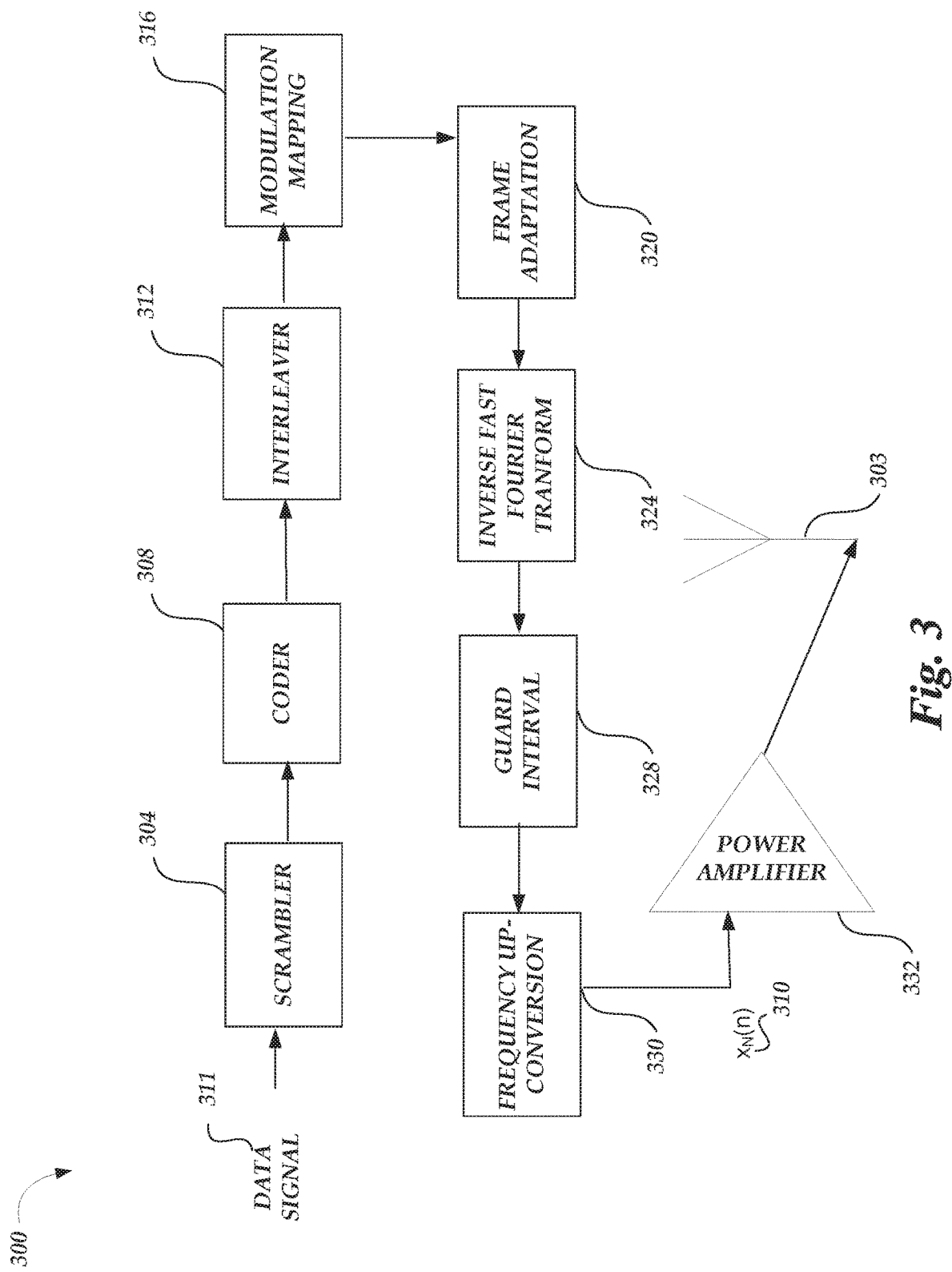
FIG. 3 is a schematic illustration of a wireless transmitter.

FIG. 3 is a schematic illustration of a wireless transmitter 300. The wireless transmitter 300 receives a data signal 311 and performs operations to generate wireless communication signals for transmission via the antenna 303. The transmitter output data $x_N(n)$ 310 is amplified by a power amplifier 332 before the output data are transmitted on an RF antenna 303. The operations to the RF-front end may generally be performed with analog circuitry or processed as a digital baseband operation for implementation of a digital front-end. The operations of the RF-front end include a scrambler 304, a coder 308, an interleaver 312, a modulation mapping 316, a frame adaptation 320, an IFFT 324, a guard interval 328, and frequency up-conversion 330.

The scrambler 304 may convert the input data to a pseudo-random or random binary sequence. For example, the input data may be a transport layer source (such as MPEG-2 Transport stream and other data) that is converted to a Pseudo Random Binary Sequence (PRBS) with a generator polynomial. While described in the example of a generator polynomial, various scramblers 304 are possible.

The coder 308 may encode the data outputted from the scrambler to code the data. For example, a Reed-Solomon (RS) encoder, turbo encoder may be used as a first coder to generate a parity block for each randomized transport packet fed by the scrambler 304. In some examples, the length of parity block and the transport packet can vary according to various wireless protocols. The interleaver 312 may interleave the parity blocks output by the coder 308, for example, the interleaver 312 may utilize convolutional byte interleaving. In some examples, additional coding and interleaving can be performed after the coder 308 and interleaver 312. For example, additional coding may include a second coder that may further code data output from the interleaver, for example, with a punctured convolutional coding having a certain constraint length. Additional interleaving may include an inner interleaver that forms groups of joined blocks. While described in the context of a RS coding, turbo coding, and punctured convolution coding, various coders 308 are possible, such as a low-density parity-check (LDPC) coder or a polar coder. While described in the context of convolutional byte interleaving, various interleavers 312 are possible.

The modulation mapping 316 may modulate the data output from the interleaver 312. For example, quadrature amplitude modulation (QAM) may be used to map the data by changing (e.g., modulating) the amplitude of the related carriers. Various modulation mappings may be used, including, but not limited to: Quadrature Phase Shift Keying (QPSK), SCMA NOMA, and MUSA (Multi-user Shared Access). Output from the modulation mapping 316 may be referred to as data symbols. While described in the context of QAM modulation, various modulation mappings 316 are possible. The frame adaptation 320 may arrange the output from the modulation mapping according to bit sequences that represent corresponding modulation symbols, carriers, and frames.

The IFFT 324 may transform symbols that have been framed into sub-carriers (e.g., by frame adaptation 320) into time-domain symbols. Taking an example of a 5G wireless protocol scheme, the IFFT can be applied as N-point IFFT:

$$x_k = \sum_{n=1}^{N} X_n e^{i2\pi kn/N} \tag{3}$$

where $X_n$ is the modulated symbol sent in the nth 5G sub-carrier. Accordingly, the output of the IFFT 324 may form time-domain 5G symbols. In some examples, the IFFT 324 may be replaced by a pulse shaping filter or poly-phase filtering banks to output symbols for frequency up-conversion 330.

In the example of FIG. 3, the guard interval 328 adds a guard interval to the time-domain 5G symbols. For example, the guard interval may be a fractional length of a symbol duration that is added, to reduce inter-symbol interference, by repeating a portion of the end of a time-domain 5G symbol at the beginning of the frame. For example, the guard interval can be a time period corresponding to the cyclic prefix portion of the 5G wireless protocol scheme.

The frequency up-conversion 330 may up-convert the time-domain 5G symbols to a specific radio frequency. For example, the time-domain 5G symbols can be viewed as a baseband frequency range and a local oscillator can mix the frequency at which it oscillates with the 5G symbols to generate 5G symbols at the oscillation frequency. A digital up-converter (DUC) may also be utilized to convert the time-domain 5G symbols. Accordingly, the 5G symbols can be up-converted to a specific radio frequency for an RF transmission.

Before transmission, at the antenna 303, a power amplifier 332 may amplify the transmitter output data $x_N(n)$ 310 to output data for an RF transmission in an RF domain at the antenna 303. The antenna 303 may be an antenna designed to radiate at a specific radio frequency. For example, the antenna 303 may radiate at the frequency at which the 5G symbols were up-converted. Accordingly, the wireless transmitter 300 may transmit an RF transmission via the antenna 303 based on the data signal 311 received at the scrambler 304. As described above with respect to FIG. 3, the operations of the wireless transmitter 300 can include a variety of processing operations. Such operations can be implemented in a conventional wireless transmitter, with each operation implemented by specifically-designed hardware for that respective operation. For example, a DSP processing unit may be specifically-designed to implement the IFFT 324. As can be appreciated, additional operations of wireless transmitter 300 may be included in a conventional wireless receiver.

The wireless transmitter 300 may be utilized to implement the wireless transmitters 111, 113 or wireless transmitters 131, 133 of FIG. 1, for example. The wireless transmitter 300 may also represent a configuration in which the DPD filter 220 and the recurrent neural network 280 may be utilized. For example, the DPD filter may at least partially compensate the data signal 311 before providing the data signal 311 to the scrambler 304. A recurrent neural network 280 may be implemented in the wireless transmitter 300, with signal paths to the recurrent neural network from any element of the transmitter path of the wireless transmitter 300.

Figure 4:
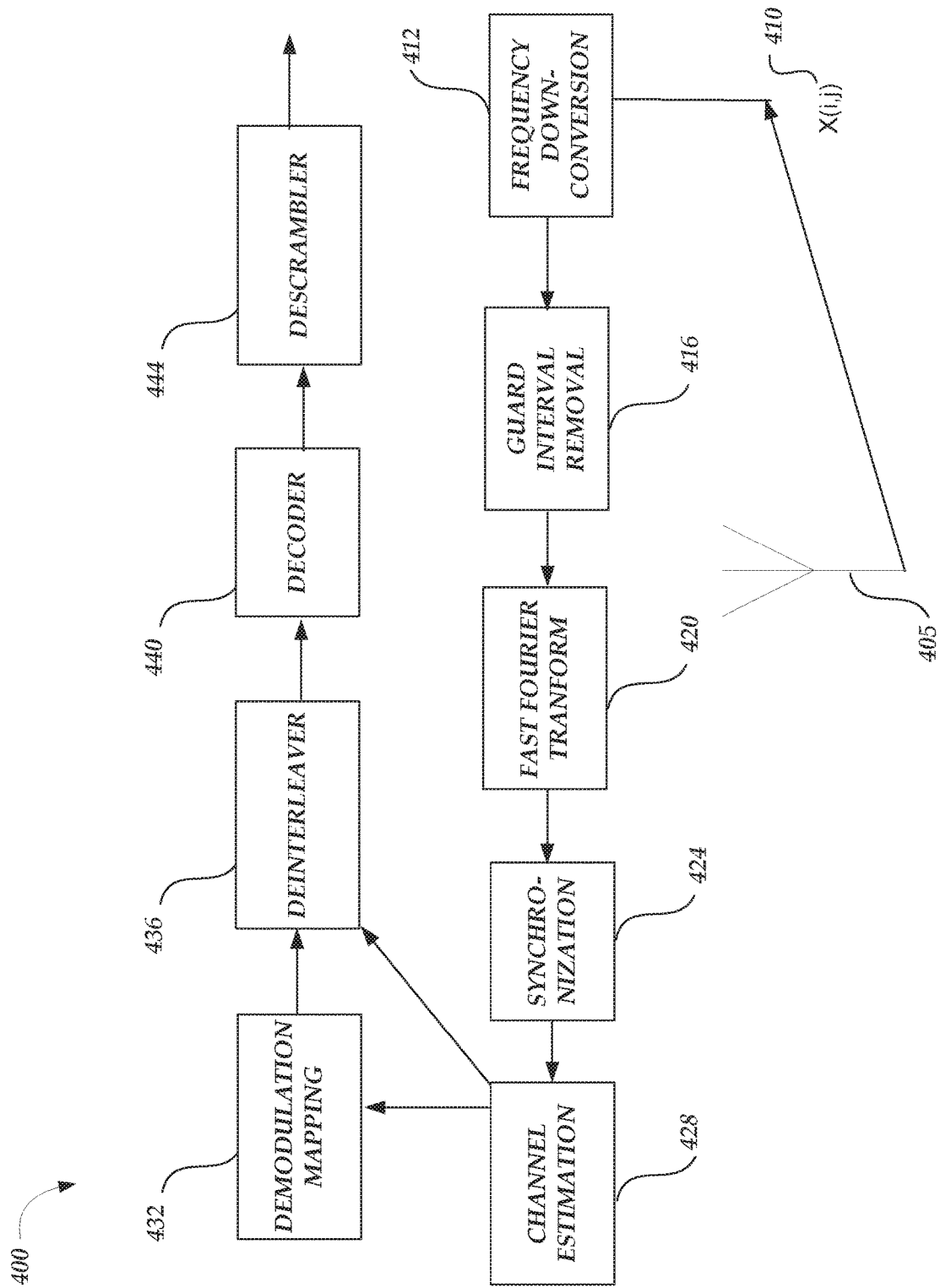
FIG. 4 is a schematic illustration of wireless receiver.

FIG. 4 is a schematic illustration of wireless receiver 400. The wireless receiver 400 receives input data X (i,j) 410 from an antenna 405 and performs operations of a wireless receiver to generate receiver output data at the descrambler 444. The antenna 405 may be an antenna designed to receive at a specific radio frequency. The operations of the wireless receiver may be performed with analog circuitry or processed as a digital baseband operation for implementation of a digital front-end. The operations of the wireless receiver include a frequency down-conversion 412, guard interval removal 416, a fast Fourier transform 420, synchronization 424, channel estimation 428, a demodulation mapping 432, a deinterleaver 436, a decoder 440, and a descrambler 444.

The frequency down-conversion 412 may down-convert the frequency domain symbols to a baseband processing range. For example, continuing in the example of a 5G implementation, the frequency-domain 5G symbols may be mixed with a local oscillator frequency to generate 5G symbols at a baseband frequency range. A digital down-converter (DDC) may also be utilized to convert the frequency domain symbols. Accordingly, the RF transmission including time-domain 5G symbols may be down-converted to baseband. The guard interval removal 416 may remove a guard interval from the frequency-domain 5G symbols. The FFT 420 may transform the time-domain 5G symbols into frequency-domain 5G symbols. Taking an example of a 5G wireless protocol scheme, the FFT can be applied as N-point FFT:

$$X_n = \sum_{k=1}^{N} x_k e^{-i2\pi kn/N} \quad (4)$$

where $X_n$ is the modulated symbol sent in the nth 5G sub-carrier. Accordingly, the output of the FFT 420 may form frequency-domain 5G symbols. In some examples, the FFT 420 may be replaced by poly-phase filtering banks to output symbols for synchronization 424.

The synchronization 424 may detect pilot symbols in the 5G symbols to synchronize the transmitted data. In some examples of a 5G implementation, pilot symbols may be detected at the beginning of a frame (e.g., in a header) in the time-domain. Such symbols can be used by the wireless receiver 400 for frame synchronization. With the frames synchronized, the 5G symbols proceed to channel estimation 428. The channel estimation 428 may also use the time-domain pilot symbols and additional frequency-domain pilot symbols to estimate the time or frequency effects (e.g., path loss) to the received signal.

For example, a channel may be estimated according to N signals received through N antennas (in addition to the antenna 405) in a preamble period of each signal. In some examples, the channel estimation 428 may also use the guard interval that was removed at the guard interval removal 416. With the channel estimate processing, the channel estimation 428 may at least partially compensate for the frequency-domain 5G symbols by some factor to reduce the effects of the estimated channel. While channel estimation has been described in terms of time-domain pilot symbols and frequency-domain pilot symbols, other channel estimation techniques or systems are possible, such as a MIMO-based channel estimation system or a frequency-domain equalization system.

The demodulation mapping 432 may demodulate the data outputted from the channel estimation 428. For example, a quadrature amplitude modulation (QAM) demodulator can map the data by changing (e.g., modulating) the amplitude of the related carriers. Any modulation mapping described herein can have a corresponding demodulation mapping as performed by demodulation mapping 432. In some examples, the demodulation mapping 432 may detect the phase of the carrier signal to facilitate the demodulation of the 5G symbols. The demodulation mapping 432 may generate bit data from the 5G symbols to be further processed by the deinterleaver 436.

The deinterleaver 436 may deinterleave the data bits, arranged as parity block from demodulation mapping into a bit stream for the decoder 440, for example, the deinterleaver 436 may perform an inverse operation to convolutional byte interleaving. The deinterleaver 436 may also use the channel estimation to at least partially compensate for channel effects to the parity blocks.

The decoder 440 may decode the data outputted from the scrambler to code the data. For example, a Reed-Solomon (RS) decoder or turbo decoder may be used as a decoder to generate a decoded bit stream for the descrambler 444. For example, a turbo decoder may implement a parallel concatenated decoding scheme. In some examples, additional decoding and/or deinterleaving may be performed after the decoder 440 and deinterleaver 436. For example, additional decoding may include another decoder that may further decode data output from the decoder 440. While described in the context of a RS decoding and turbo decoding, various decoders 440 are possible, such as low-density parity-check (LDPC) decoder or a polar decoder.

The descrambler 444 may convert the output data from decoder 440 from a pseudo-random or random binary sequence to original source data. For example, the descrambler 44 may convert decoded data to a transport layer destination (e.g., MPEG-2 transport stream) that is descrambled with an inverse to the generator polynomial of the scrambler 304. The descrambler thus outputs receiver output data. Accordingly, the wireless receiver 400 receives an RF transmission including input data X (i,j) 410 via to generate the receiver output data.

As described herein, for example with respect to FIG. 4, the operations of the wireless receiver 400 can include a variety of processing operations. Such operations can be implemented in a conventional wireless receiver, with each operation implemented by specifically-designed hardware for that respective operation. For example, a DSP processing unit may be specifically-designed to implement the FFT 420. As can be appreciated, additional operations of wireless receiver 400 may be included in a conventional wireless receiver.

The wireless receiver 400 may be utilized to implement the wireless receivers the wireless receivers 115, 117 or wireless receivers 135, 137 of FIG. 1, for example. The wireless receiver 400 may also represent a configuration in which the recurrent neural network 280 may be utilized. For example, wireless receiver 400 may provide a feedback signal to a recurrent neural network 280 after descrambling the feedback signal at the descrambler 444. Accordingly, a recurrent neural network 280 may be implemented in the wireless receiver 400 with a signal path to the recurrent neural network from the receiver path of the wireless receiver 400.

Figure 5A:
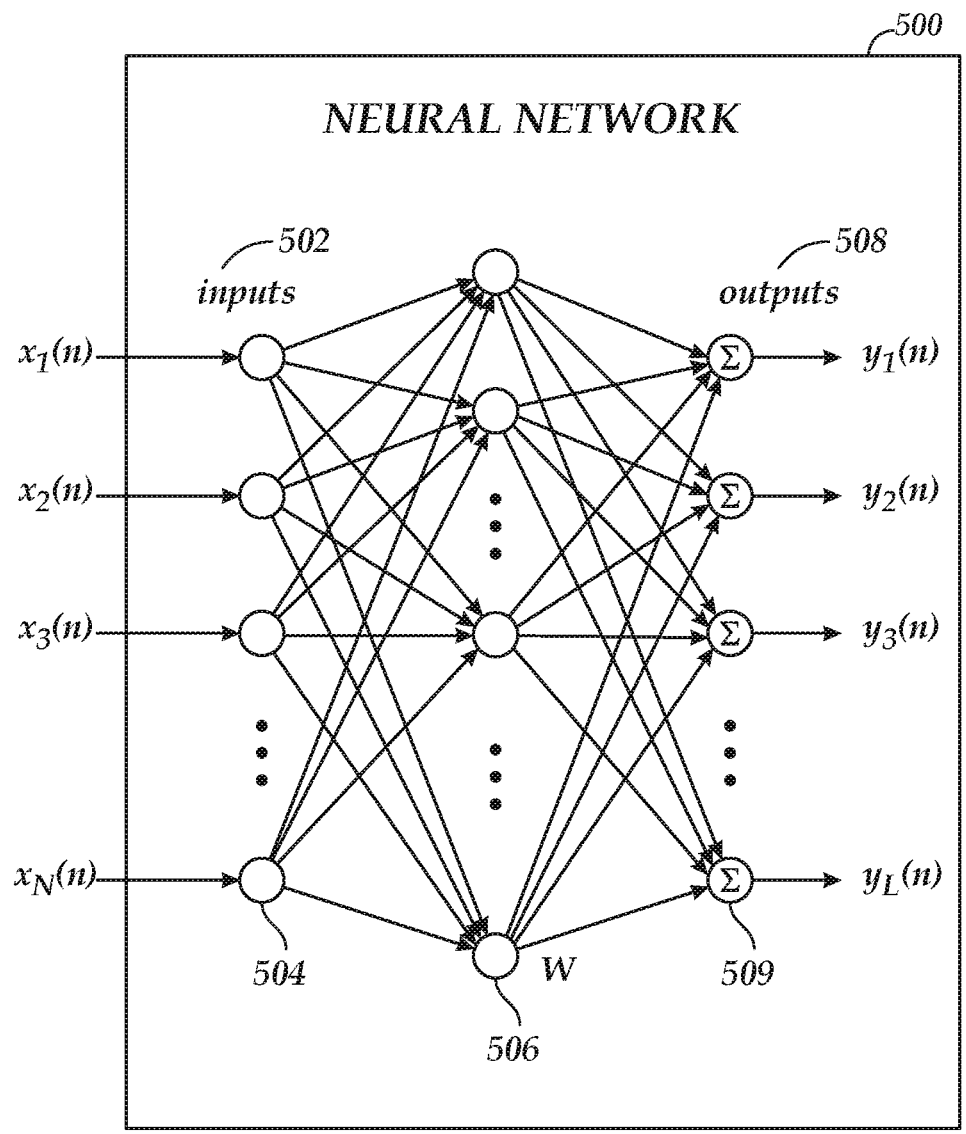
FIG. 5A is a schematic illustration of an example neural network in accordance with examples described herein.

FIG. 5A is a schematic illustration of an example neural network 500 arranged in accordance with examples described herein. The neural network 500 includes a network of processing elements 504, 506, 509 that output adjusted signals $y_1(n)$, $y_2(n)$, $y_3(n)$, $y_L(n)$ 508 based on the feedback signal X(n) 277, depicted in FIG. 5A as $x_1(n)$, $x_2(n)$, $x_3(n)$, $x_N(n)$ 502. The processing elements 504 receive the feedback signal X(n) 277 as $x_1(n)$, $x_2(n)$, $x_3(n)$, $x_N(n)$ 502 as inputs.

The processing elements 504 may be implemented, for example, using bit manipulation units that may forward the signals $x_1(n)$, $x_2(n)$, $x_3(n)$, $x_N(n)$ 502 to processing elements 506. In some implementations, a bit manipulation unit may perform a digital logic operation on a bitwise basis. For example, a bit manipulation unit may be a NOT logic unit, an AND logic unit, an OR logic unit, a NOR logic unit, a NAND logic unit, or an XOR logic unit. Processing elements 506 may be implemented, for example, using multiplication units that include a nonlinear vector set (e.g., center vectors) based on a nonlinear function, such as a Gaussian function (e.g.,:

$$f(r) = \exp\left(-\frac{r^2}{\sigma^2}\right),$$

a multi-quadratic function (e.g., $f(r)=(r^2+\sigma^2)$), an inverse multi-quadratic function (e.g., $f(r)=(r^2+\sigma^2)$), a thin-plate spine function (e.g., $f(r)=r^2 \log(r)$), a piece-wise linear function (e.g., $$f(r) = \frac{1}{2}(|r+1| - |r-1|),$$

or a cubic approximation function (e.g., $$f(r) = \frac{1}{2}(|r^3+1| - |r^3-1|)\Big).$$

In some examples, the parameter σ is a real parameter (e.g., a scaling parameter) and r is the distance between the input signal (e.g., $x_1(n)$, $x_2(n)$, $x_3(n)$, $x_N(n)$ 502) and a vector of the nonlinear vector set. Processing elements 509 may be implemented, for example, using accumulation units that sum the intermediate processing results received from each of the processing elements 506. In communicating the intermediate processing results, each intermediate processing result may be weighted with a weight 'W'. For example, the multiplication processing units may weight the intermediate processing results based on a minimized error for the all or some of the adjustment signals that may generated by a neural network.

The processing elements 506 include a nonlinear vector set that may be denoted as $C_i$ (for i=1, 2, . . . H). H may represent the number of processing elements 506. With the signals $x_1(n)$, $x_2(n)$, $x_3(n)$, $x_N(n)$ 502 received as inputs to processing elements 506, after forwarding by processing elements 504, the output of the processing elements 506, operating as multiplication processing units, may be expressed as $h_i(n)$, such that:

$$h_i(n) = f_i(\|X(n) - C_i\|) \quad (i=1,2,\ldots,H) \tag{5}$$

$f_i$ may represent a nonlinear function that is applied to the magnitude of the difference between $x_1(n)$, $x_2(n)$, $x_3(n)$, $x_N(n)$ 502 and the center vectors $C_i$. The output $h_i(n)$ may represent a nonlinear function such as a Gaussian function, multi-quadratic function, an inverse multi-quadratic function, a thin-plate spine function, or a cubic approximation function.

The output $h_i(n)$ of the processing elements 506 may be weighted with a weight matrix 'W'. The output h(n) of the processing elements 506 can be referred to as intermediate processing results of the neural network 500. For example, the connection between the processing elements 506 and processing elements 509 may be a linear function such that the summation of a weighted output $h_i(n)$ such that the output data $y_1(n)$, $y_2(n)$, $y_3(n)$, $y_L(n)$ 508 may be expressed, in Equation 6 as:

$$y_i(n) = \sum_{j=1}^{H} W_{ij} h_j(n) = \sum_{j=1}^{H} W_{ij} f_j(\|X(n) - C_j\|)(i = 1, 2, \ldots \ldots, L \quad (6)$$

Accordingly, the output data $y_1(n)$, $y_2(n)$, $y_3(n)$, $y_L(n)$ 508 may be the output $y_i(n)$ of the i'th processing element 509 at time n, where L is the number of processing elements 509. $W_{ij}$ is the connection weight between j'th processing element 506 and i'th processing element 509 in the output layer. Advantageously, the output data $y_1(n)$, $y_2(n)$, $y_3(n)$, $y_L(n)$ 508, generated from the feedback signal X(n) 277, or $x_1(n)$, $x_2(n)$, $x_3(n)$, $x_N(n)$ 502, may be utilized by a DPD filter as filter coefficient data, to compensate for nonlinear power amplifier noise introduced by a power amplifier, e.g., the compensation may be performed to modify subsequent input signals provided to a power amplifier in a manner that causes the power amplifier output to have a reduced presence of power amplifier noise. Accordingly, a wireless device or system that implements a neural network 500 may wholly and/or partially compensate for such nonlinear power amplifier noise.

While the neural network 500 has been described with respect to a single layer of processing elements 506 that include multiplication units, it can be appreciated that additional layers of processing elements with multiplication units may be added between the processing elements 504 and the processing elements 509. The neural network is scalable in hardware form, with additional multiplication units being added to accommodate additional layers. Using the methods and systems described herein, additional layer(s) of processing elements including multiplication processing units and the processing elements 506 may be optimized to determine the center vectors $C_i$ and the connection weights $W_{ij}$ of each layer of processing elements including multiplication units. In some implementations, for example as described with reference to FIGS. 5C-5E, layers of processing elements 506 may include multiplication/accumulation (MAC) units, with each layer having additional MAC units. Such implementations, having accumulated the intermediate processing results in a respective processing elements (e.g., the respective MAC unit), may also include memory look-up (MLU) units that are configured to retrieve a plurality of coefficients and provide the plurality of coefficients as the connection weights for the respective layer of processing elements 506 to be mixed with the input data.

The neural network 500 can be implemented using one or more processors, for example, having any number of cores. An example processor core can include an arithmetic logic unit (ALU), a bit manipulation unit, a multiplication unit, an accumulation unit, a multiplication/accumulation (MAC) unit, an adder unit, a look-up table unit, a memory look-up unit, or any combination thereof. In some examples, the neural network 240 may include circuitry, including custom circuitry, and/or firmware for performing functions described herein. For example, circuitry can include multiplication unit, accumulation units, MAC units, and/or bit manipulation units for performing the described functions, as described herein. The neural network 240 may be implemented in any type of processor architecture including but not limited to a microprocessor or a digital signal processor (DSP), or any combination thereof.

Figure 5B:
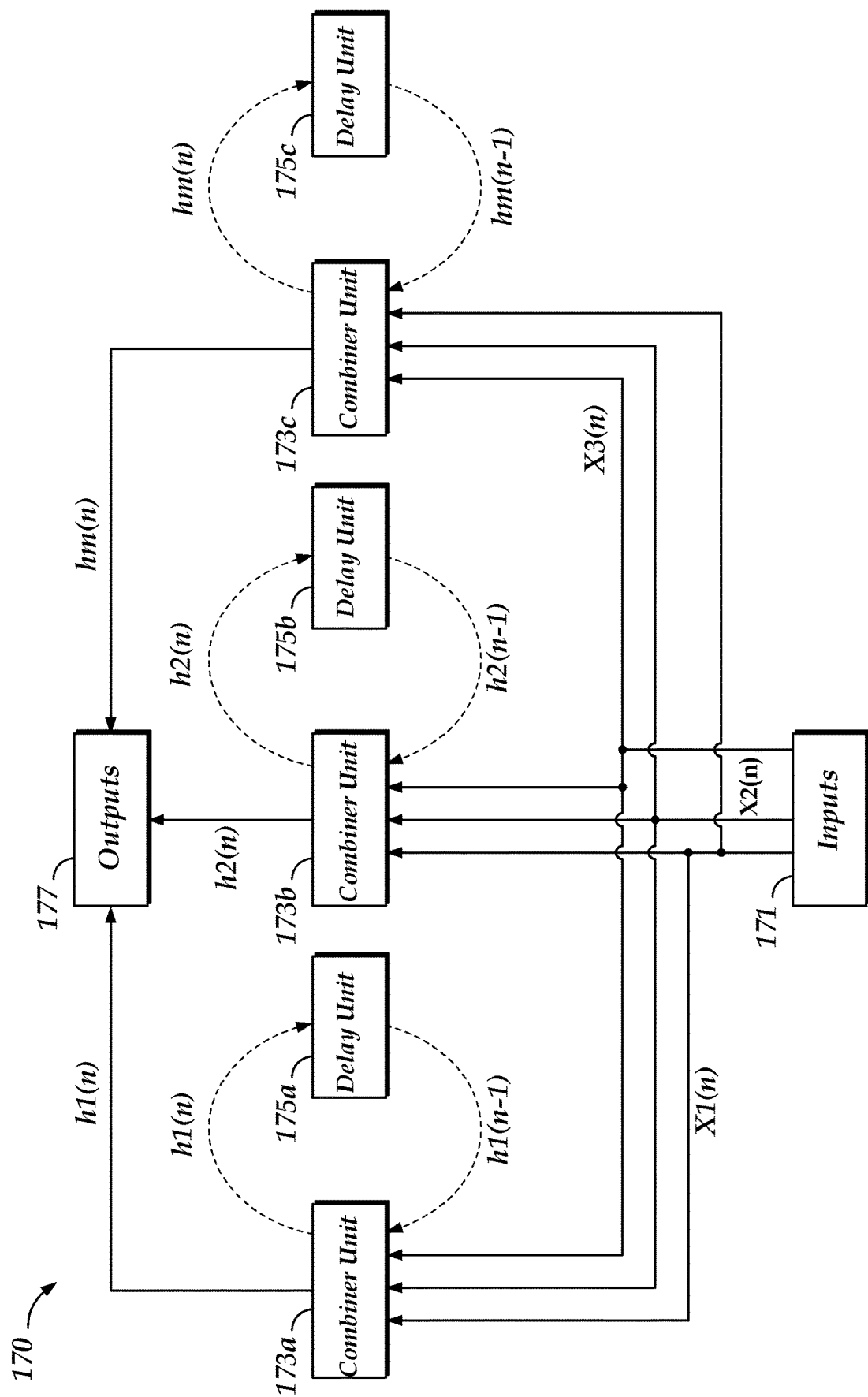
FIG. 5B is a schematic illustration of a recurrent neural network arranged in accordance with examples described herein.

FIG. 5B is a schematic illustration of a recurrent neural network arranged in accordance with examples described herein. The recurrent neural network 170 include three stages (e.g., layers): an inputs stage 171; a combiner stage 173 and 175, and an outputs stage 177. While three stages are shown in FIG. 5B, any number of stages may be used in other examples, e.g., as described with reference to FIGS. 5C-5E. In some implementations, the recurrent neural network 170 may have multiple combiner stages such that outputs from one combiner stage is provided to another combiners stage, until being providing to an outputs stage 177. As described with reference to FIG. 5C, for example, there may be multiple combiner stages in a neural network 170. As depicted in FIG. 5B, the delay units 175a, 175b, and 175c may be optional components of the neural network 170. When such delay units 175a, 175b, and 175c are utilized as described herein, the neural network 170 may be referred to as a recurrent neural network. Accordingly, the recurrent neural network 170 can be used to implement any of the recurrent neural networks described herein; for example, the recurrent neural network 280 of FIG. 2 or, as described below, a recurrent neural network 840 of FIG. 8.

The first stage of the neural network 170 includes inputs node 171. The inputs node 171 may receive input data at various inputs of the recurrent neural network. The second stage of the neural network 170 is a combiner stage including combiner units 173a, 173b, 173c; and delay units 175a, 175b, 175c. Accordingly, the combiner units 173 and delay units 175 may be collectively referred to as a stage of combiners. Accordingly, in the example of FIG. 5C with recurrent neural network 512 implementing such combiners, such a recurrent neural network 512 can implements the combiner units 173a-c and delay units 175a-c in the second stage. In such an implementation, the recurrent neural network 512 may perform a nonlinear activation function using the input data from the inputs node 171 (e.g., input signals X1(n), X2(n), and X3(n)). The third stage of neural network 170 includes the outputs node 177. Additional, fewer, and/or different components may be used in other examples. Accordingly, the recurrent neural network 170 can be used to implement any of the recurrent neural networks described herein; for example, any of the recurrent neural networks 512 of FIGS. 5C-5E.

The recurrent neural network 170 includes delay units 175a, 175b, and 175c, which generate delayed versions of the output from the respective combiner units 173a-c based on receiving such output data from the respective combiner units 173a-c. In the example, the output data of combiner units 173a-c may be represented as h(n); and, accordingly, each of the delay units 175a-c delay the output data of the combiner units 173a-c to generate delayed versions of the output data from the combiner units 173a-c, which may be represented as h(n−t). In various implementations, the amount of the delay, t, may also vary, e.g., one clock cycle, two clock cycles, or one hundred clock cycles. That is, the delay unit 175 may receive a clock signal and utilize the clock signal to identify the amount of the delay. In the example of FIG. 5B, the delayed versions are delayed by one time period, where '1' represents a time period. A time period may corresponds to any number of units of time, such as a time period defined by a clock signal or a time period defined by another element of the neural network 170. In various implementations, the delayed versions of the output from the respective combiner units 173a-c may be referred to as signaling that is based on the output data of combiner units 173a-c.

Continuing in the example of FIG. 5B, each delay unit 175a-c provides the delayed versions of the output data from the combiner units 173a-c as input to the combiner units 173a-c, to operate, optionally, as a recurrent neural network. Such delay units 175a-c may provide respective delayed versions of the output data from nodes of the combiner units 173*a-c* to respective input units/nodes of the combiner units 173*a-c*. In utilizing delayed versions of output data from combiner units 173*a-c*, the recurrent neural network 170 may train weights at the combiner units 173 *a-c* that incorporate time-varying aspects of input data to be processed by such a recurrent neural network 170. Once trained, in some examples, the inputs node 171 receives wireless data to be transmitted from nonlinear power amplifiers, e.g., as a plurality of feedback signals X(n) 277. Accordingly, the input nodes 171 receive such feedback signals X(n) 277 and process that as input data in the recurrent neural network 170 *a*. Accordingly, because an RNN 170 incorporates the delayed versions of output data from combiner units 173*a-c*, the time-varying nature of the input data may provide faster and more efficient processing of the input data, such as feedback signals X(n) 277.

Examples of recurrent neural network training and inference can be described mathematically. Again, as an example, consider input data at a time instant (n), given as: $X(n)=[x_1(n), x_2(n), \ldots x_m(n)]^T$. The center vector for each element in hidden layer(s) of the recurrent neural network 170 (e.g., combiner units 173*a-c*) may be denoted as $C_i$ (for i=1, 2, ..., H, where H is the element number in the hidden layer). The output of each element in a hidden layer may then be given as:

$$h_i(n) = f_i(\|X(n) + h_i(n-t) - C_i\|) \text{ for } (i=1,2,\ldots,H) \quad (7)$$

t may be the delay at the delay unit 175 such that the output of the combiner units 173 includes a delayed version of the output of the combiner units 173. In some examples, this may be referred to as feedback of the combiner units 173. Accordingly, each of the connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$y_i(n) = \sum_{j=1}^{H} W_{ij} h_j(n) + W_{ij} h_j(n-t) = \sum_{j=1}^{H} W_{ij} f_j(\|X(n) + h_i(n-t) - C_j\|) \quad (8)$$

for (i=1, 2, ..., L) and where L is the element number of the output of the output layer and $W_{ij}$ is the connection weight between the j'th element in the hidden layer and the i'th element in the output layer.

Additionally or alternatively, while FIG. 5B has been described with respect to a single stage of combiners (e.g., second stage) including the combiner units 173*a-c* and delay units 175*a-c*, it can be appreciated that multiple stages of similar combiner stages may be included in the neural network 170 with varying types of combiner units and varying types of delay units with varying delays, for example, as will now be described with reference to FIGS. 5C-5E.

Figure 5C:
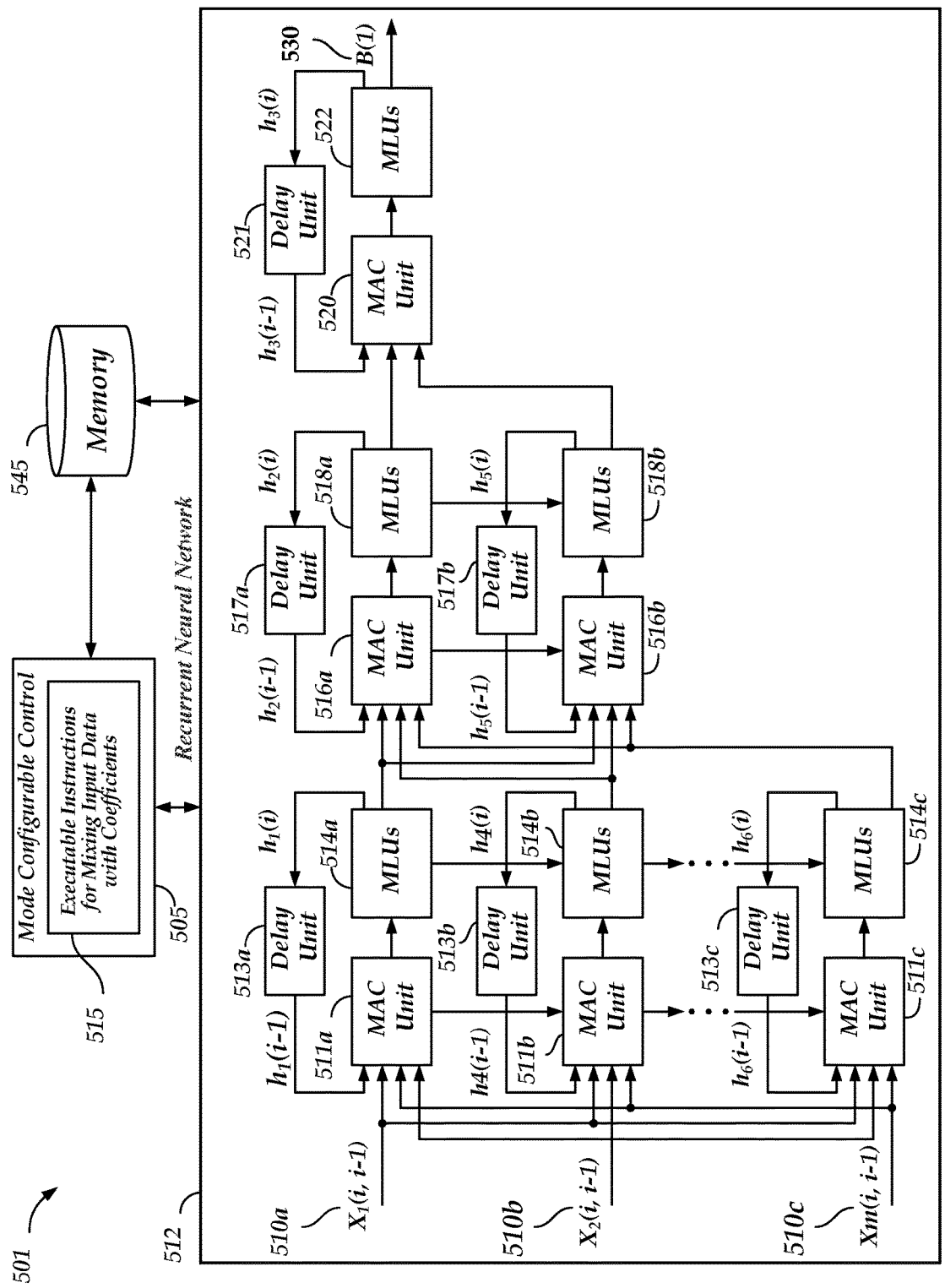
FIGS. 5C-5E are schematic illustrations of example recurrent neural networks in accordance with examples described herein.

FIG. 5C is a schematic illustration of a recurrent neural network 512 arranged in a system 501 in accordance with examples described herein. Such a hardware implementation (e.g., system 501) may be used, for example, to implement one or more neural networks, such as the recurrent neural network 240 of FIG. 2, the neural network 500 of FIG. 5A or recurrent neural network 170 of FIG. 5B. Additionally or alternatively, in some implementations, the recurrent neural network 512 may receive input data 510*a*, 510*b*, and 510*c* from such a computing system. The input data 510*a*, 510*b*, and 510*c* may be the feedback signal X(n) 277, which may be stored in a memory 545. In some examples, data stored in the memory 545 may be a plurality of feedback signals X(n) 277. In an example in which the electronic device 110 is coupled to the plurality of antennas 101 and 103, the input data 510*a* $X_1(i, i-1)$ may correspond to a first feedback signal X(n) 277 based on a first RF transmission to be transmitted at the antenna 101 at a first frequency; the input data 510*b* $X_2(i, i-1)$ may correspond to a second feedback signal X(n) 277 based on a second RF transmission to be transmitted at the antenna 103 at a second frequency; and the input data 510*c* $X_m(i, i-1)$ may correspond to a m'th feedback signal X(n) 277 based on a m'th RF transmission to be transmitted at an m'th antenna at a m'th frequency. m may represent the number of antennas, with each antenna transmitting a portion of input data.

As denoted in the representation of the input data signals, the input data 510*a* $X_1(i, i-1)$ includes a current portion of the input data, at time i, and a previous portion of the input data, at time i−1. For example, a current portion of the input data may be a sample of a first feedback signal X(n) 277 at a certain time period (e.g., at time i), while a previous portion of the input data may be a sample of the first feedback signal X(n) 277 at a time period previous to the certain time period (e.g., at time i−1). Accordingly, the previous portion of the input data may be referred to as a time-delayed version of the current portion of the input data. The portions of the input data at each time period may be obtained in a vector or matrix format, for example. In an example, a current portion of the input data, at time i, may be a single value; and a previous portion of the input data, at time i−1, may be a single value. Thus, the input data 510*a* $X_1(i, i-1)$ may be a vector. In some examples, the current portion of the input data, at time i, may be a vector value; and a previous portion of the input data, at time i−1, may be a vector value. Thus, the input data 510*a* $X_1(i, i-1)$ may be a matrix.

Such input data, which is obtained with a current and previous portion of input data, may be representative of a Markov process, such that a causal relationship between at least the current sample and the previous sample may improve the accuracy of weight estimation for training of a plurality of coefficients to be utilized by the MAC units and MLUs of the recurrent neural network 512. As noted previously, the input data 510 may represent data to be transmitted (e.g., amplified signals) at a first frequency and/or data to be transmitted at a first wireless channel. Accordingly, the input data 510*b* X2(i, i−1) may represent data to be transmitted at a second frequency or at a second wireless channel, including a current portion of the input data, at time i, and a previous portion of the input data, at time i−1. And, the number of input signals to be transmitted by the recurrent neural network 512 may equal in some examples to a number of antennas coupled to an electronic device 110 implementing the recurrent neural network 512. Accordingly, the input data 510*c* Xm(i, i−1) may represent data to be transmitted at a m'th frequency or at a m'th wireless channel, including a current portion of the input data, at time i, and a previous portion of the input data, at time i−1.

The recurrent neural network 512 may include multiplication unit/accumulation (MAC) units 511*a-c*, 516*a-b*, and 520, delay units 513*a-c*, 517*a-b*, and 521, and memory lookup units (MLUs) 514*a-c*, 518*a-b*, and 522 that, when mixed with input data to be transmitted from the memory 545, may generate output data (e.g. B (1)) 530. Each set of MAC units and MLU units having different element numbers may be referred to as a respective stage of combiners for the recurrent neural network 512. For example, a first stage of combiners includes MAC units 511*a-c* and MLUs 514*a-c*, operating in conjunction with delay units 513*a-c*, to form a first stage or "layer," as referenced with respect to FIG. 5A having "hidden" layers as various combiner stages. Continuing in the example, the second stage of combiners includes MAC units 516a-b and MLUs 518a-b, operating in conjunction with delay units 517a-b, to form a second stage or second layer of hidden layers. And the third stage of combiners may be a single combiner including the MAC unit 520 and MLU 522, operating in conjunction with delay unit 521, to form a third stage or third layer of hidden layers.

The recurrent neural network 512, may be provided instructions 515, stored at the mode configurable control 505, to cause the recurrent neural network 512 to configure the multiplication units 511a-c, 516a-c, and 520 to multiply and/or accumulate input data 510a, 510b, and 510c and delayed versions of processing results from the delay units 513a-c, 517a-b, and 521 (e.g., respective outputs of the respective layers of MAC units) with a plurality of coefficients to generate the output data 530 B(1). For example, the mode configurable control 505 may execute instructions that cause the memory 545 to provide a plurality of coefficients (e.g., weights and/or other parameters) stored in the memory 545 to the MLUs 514a-c, 518a-b, and 522 as weights for the MAC units 511a-c, 516a-b, and 520 and delay units 513a-c, 517a-b, and 521.

As denoted in the representation of the respective outputs of the respective layers of MAC units (e.g., the outputs of the MLUs 514a-c, 518a-b, and 522), the input data to each MAC unit 511a-c, 516a-b, and 520 includes a current portion of input data, at time i, and a delayed version of a processing result, at time i−1. For example, a current portion of the input data may be a sample of a first feedback signal X(n) 277 at a certain time (e.g., at time i), while a delayed version of a processing result may be obtained from the output of the delay units 513a-c, 517a-b, and 521, which is representative of a time previous to the certain time (e.g., as a result of the introduced delay). Accordingly, in using such input data, obtained from both a current period and at least one previous period, output data B(1) 530 may be representative of a Markov process, such that a causal relationship between at least data from a current time period and a previous time period may be used to improve the accuracy of weight estimation for training of a plurality of coefficients to be utilized by the MAC units and MLUs of the recurrent neural network 512 or inference of signals to be transmitted in utilizing the recurrent neural network 512. As noted previously, the input data 510 may represent various feedback signals X(n) 277. And, the number of input signals obtained by the recurrent neural network 512 may equal in some examples to a number of antennas coupled to an electronic device 110 implementing the recurrent neural network 512. Accordingly, the input data 510c Xm(i, i−1) may represent data obtained at a m'th frequency or at a m'th wireless channel, including a current portion of the input data, at time i. Accordingly, in utilizing delayed versions of output data from 513a-c, 517a-b, and 521 the recurrent neural network 170 provides individualized frequency-band, time-correlation data for processing of signals to be transmitted.

In an example of executing such instructions 515 for mixing input data with coefficients, at a first layer of the MAC units 511a-c and MLUs 514a-c, the multiplication unit/accumulation units 511a-c are configured to multiply and accumulate at least two operands from corresponding input data 510a, 510b, or 510c and an operand from a respective delay unit 513a-c to generate a multiplication processing result that is provided to the MLUs 514a-c. For example, the multiplication unit/accumulation units 511a-c may perform a multiply-accumulate operation such that three operands, M N, and T are multiplied with respective coefficients of a plurality of coefficients, and then added with P to generate a new version of P that is stored in its respective MLU 514a-c. Accordingly, the MLU 514a latches the multiplication processing result, until such time that the stored multiplication processing result is be provided to a next layer of MAC units. The MLUs 514a-c, 518a-b, and 522 may be implemented by any number of processing elements that operate as a memory look-up unit such as a D, T, SR, and/or JK latches.

Additionally in the example, the MLU 514a provides the processing result to the delay unit 513a. The delay unit 513a delays the processing result (e.g., h1(i)) to generate a delayed version of the processing result (e.g., h1(i−1)) to output to the MAC unit 511a as operand T. While the delay units 513a-c, 517a-b, and 521 of FIG. 5C are depicted introducing a delay of '1', it can be appreciated that varying amounts of delay may be introduced to the outputs of first layer of MAC units. For example, a clock signal that introduced a sample delay of '1' (e.g., h1(i−1)) may instead introduce a sample delay of '2', '4', or '100'. In various implementations, the delay units 513a-c, 517a-b, and 521 may correspond to any number of processing units that can introduce a delay into processing circuitry using a clock signal or other time-oriented signal, such as flops (e.g., D-flops) and/or one or more various logic gates (e.g., AND, OR, NOR, etc. . . . ) that may operate as a delay unit.

In the example of a first hidden layer of a recurrent neural network, the MLUs 514a-c may retrieve a plurality of coefficients stored in the memory 545, which may be weights associated with weights to be applied to the first layer of MAC units to both the data from the current period and data from a previous period (e.g., the delayed versions of first layer processing results). For example, the MLU 514a can be a table look-up that retrieves one or more coefficients of a plurality of coefficients to be applied to both operands M and N, as well as an additional coefficient to be applied to operand T. The MLUs 514a-c also provide the generated multiplication processing results to the next layer of the MAC units 516a-b and MLUs 518a-b. The additional layers of the MAC units 516a, 516b and MAC unit 520 working in conjunction with the MLUs 518a, 518b and MLU 522, respectively, may continue to process the multiplication results to generate the output data 530 B(n). Using such a circuitry arrangement, the output data 530 B(1) may be generated from the input data 510a, 510b, and 510c.

Figure 5D:
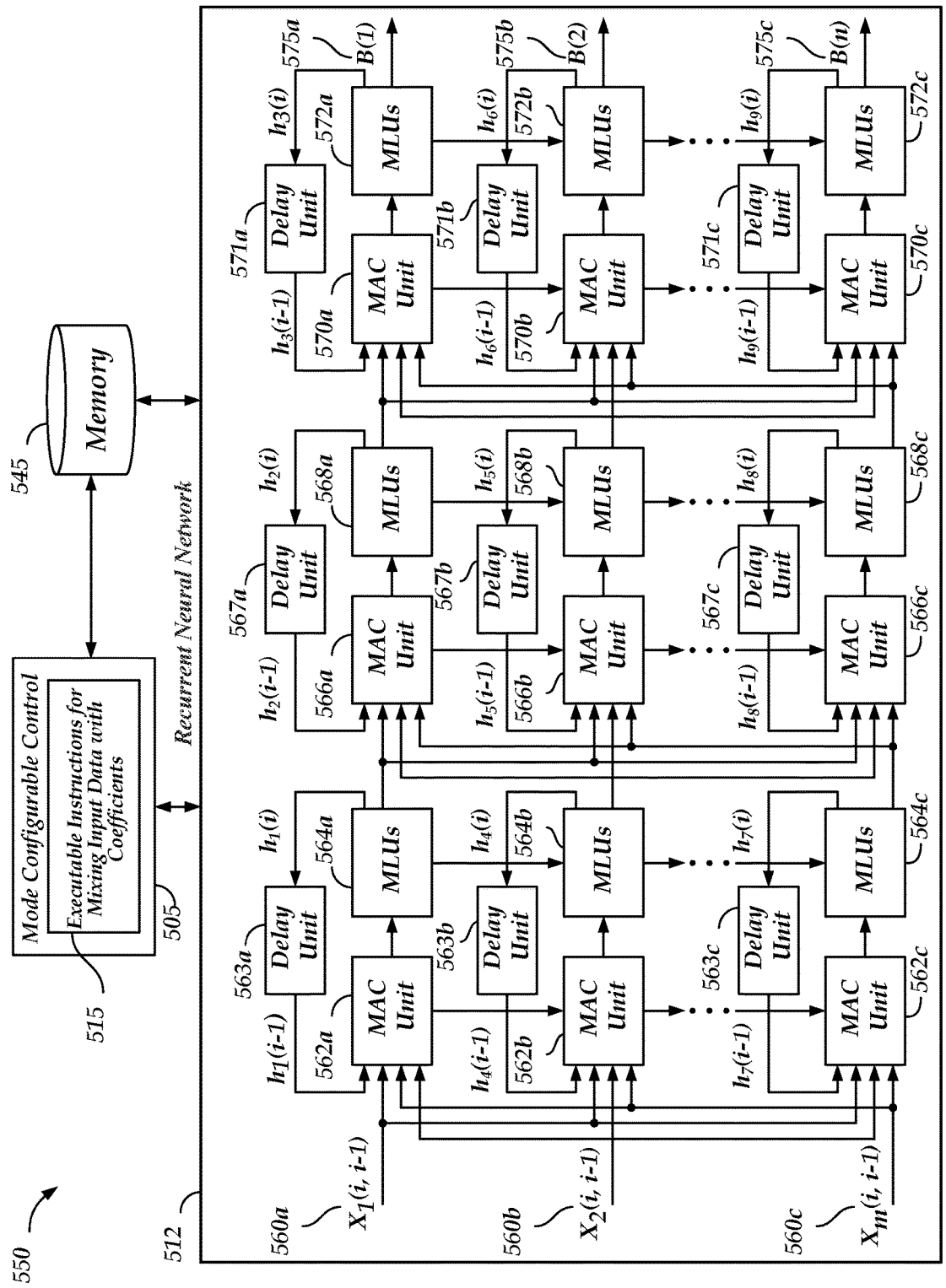

Advantageously, the recurrent neural network 512 of system 501 may utilize a reduced number of MAC units and/or MLUs, e.g., as compared to the recurrent neural network 512 of FIG. 5D. As described above, the number of MAC units and MLUs in each layer of the recurrent neural network 512 is associated with a number of channels and/or a number of antennas coupled to a device in which the recurrent neural network 512 is being implemented. For example, the first layer of the MAC units and MLUs may include m number of those units, where m represents the number of antennas. Each subsequent layer may have a reduced portion of MAC units, delay units, and MLUs. As depicted, in FIG. 5C for example, a second layer of MAC units 516a-b, delay unit 517a-b, and MLUs 518a-b may include m−1 MAC units and MLUs, when m=3. Accordingly, the last layer in the recurrent neural network 512, including the MAC unit 520, delay unit 521, and MLU 522, includes only one MAC, one delay unit, and one MLU. Because the recurrent neural network 512 utilizes input data 510a, 510b, and 510c that may represent a Markov process, the number of MAC units and MLUs in each subsequent layer of the processing unit may be reduced, without a substantial loss in precision as to the output data 530 B(1); for example, when compared to a recurrent neural network 512 that includes the same number of MAC units and MLUs in each layer, like that of recurrent neural network 512 of system 550.

The plurality of coefficients, for example from memory 545, can be mixed with the input data 510*a*-510*c* and delayed version of processing results to generate the output data 530 B(1). For example, the relationship of the plurality of coefficients to the output data 530 B(1) based on the input data 510*a-c* and the delayed versions of processing results may be expressed as:

$$B(1) = a^1 * f\left(\sum_{j=1}^{m-1} a^{(m-1)} f_j\left(\sum_{k=1}^{m} a^{(m)} X_k(i)\right)\right) \quad (9)$$

where a(m), a(m−1), al are coefficients for the first layer of multiplication/accumulation units 511*a-c* and outputs of delay units 513*a-c*; the second layer of multiplication/accumulation units 516*a-b* and outputs of delay units 517*a-b*; and last layer with the multiplication/accumulation unit 520 and output of delay unit 521, respectively; and where f(•) is the mapping relationship which may be performed by the memory look-up units 514*a-c* and 518*a-b*. As described above, the memory look-up units 514*a-c* and 518*a-b* retrieve coefficients to mix with the input data and respective delayed versions of each layer of MAC units. Accordingly, the output data may be provided by manipulating the input data and delayed versions of the MAC units with the respective multiplication/accumulation units using a set of coefficients stored in the memory. A plurality of coefficients may be associated with vectors representative of nonlinear power amplifier noise. A plurality of coefficients may be based on connection weights obtained from the training of a recurrent neural network (e.g., recurrent neural network 280). The resulting mapped data may be manipulated by additional multiplication/accumulation units and additional delay units using additional sets of coefficients stored in the memory associated with the desired wireless protocol. The sets of coefficients multiplied at each stage of the recurrent neural network 512 may represent or provide an estimation of the processing of the input data in specifically-designed hardware (e.g., an FPGA).

Further, it can be shown that the system 501, as represented by Equation (9), may approximate any nonlinear mapping with arbitrarily small error in some examples and the mapping of system 501 may be determined by the coefficients a(m), a(m−1), al. For example, if such coefficients of a plurality of coefficients are specified, any mapping and processing between the input data 510*a*-510*c* and the output data 530 may be accomplished by the system 501. For example, the plurality of coefficients may represent nonlinear mappings of the input data 510*a-c* to the output data B(1) 530. In some examples, the nonlinear mappings of the plurality of coefficients may represent a Gaussian function, a piece-wise linear function, a sigmoid function, a thin-plate-spline function, a multi-quadratic function, a cubic approximation, an inverse multi-quadratic function, or combinations thereof. In some examples, some or all of the memory look-up units 514*a-c*, 518*a-b* may be deactivated. For example, one or more of the memory look-up units 514*a-c*, 518*a-b* may operate as a gain unit with the unity gain. Such a relationship, as derived from the circuitry arrangement depicted in system 501, may be used to train an entity of the computing system 501 to generate the plurality of coefficients. For example, using Equation (9), an entity of the computing system 501 may compare input data to the output data to generate the plurality of coefficients.

Each of the multiplication unit/accumulation units 511*a-c*, 516*a-b*, and 520 may include multiple multipliers, multiple accumulation unit, or and/or multiple adders. Any one of the multiplication unit/accumulation units 511*a-c*, 516*a-b*, and 520 may be implemented using an ALU. In some examples, any one of the multiplication unit/accumulation units 511*a-c*, 516*a-b*, and 520 can include one multiplier and one adder that each perform, respectively, multiple multiplications and multiple additions. The input-output relationship of a multiplication/accumulation unit 511*a-c*, 516*a-b*, and 520 may be represented as:

$$B_{Out} = \sum_{i=1}^{I} C_i * B_{in}(i) \quad (10)$$

where "I" represents a number to perform the multiplications in that unit, $C_i$ the coefficients which may be accessed from a memory, such as memory 545, and $B_{in}(i)$ represents a factor from either the input data 510*a-c* or an output from multiplication unit/accumulation units 511*a-c*, 516*a-b*, and 520. In an example, the output of a set of multiplication unit/accumulation units, $B_{out}$, equals the sum of a plurality of coefficients, $C_i$ multiplied by the output of another set of multiplication unit/accumulation units, $B_{in}(i)$. $B_{in}(i)$ may also be the input data such that the output of a set of multiplication unit/accumulation units, $B_{out}$, equals the sum of a plurality of coefficients, $C_i$ multiplied by input data.

While described in FIG. 5C as a recurrent neural network 512, it can be appreciated that the recurrent neural network 512 may be implemented in or as any of the recurrent neural networks described herein, in operation to cancel and/or compensate nonlinear power amplifier via the calculation of such noise as implemented in a recurrent neural network. For example, the recurrent neural network 512 can be used to implement any of the recurrent neural networks described herein; for example, the recurrent neural network 280 of FIG. 2 or recurrent neural network 840 of FIG. 8. In such implementations, recurrent neural networks may be used to reduce and/or improve errors which may be introduced by nonlinear power amplifier noise. Advantageously, with such an implementation, wireless systems and devices implementing such RNNs may increase capacity of their respective wireless networks because additional data may be transmitted in such networks, which would not otherwise be transmitted due to the effects of nonlinear power amplifier noise.

FIG. 5D is a schematic illustration of a recurrent neural network 512 arranged in a system 550 in accordance with examples described herein. Such a hardware implementation (e.g., system 550) may be used, for example, to implement one or more neural networks, such as the recurrent neural network 240 of FIG. 2, the neural network 500 of FIG. 5A, or recurrent neural network 170 of FIG. 5B. Similarly described elements of FIG. 5D may operate as described with respect to FIG. 5C, but may also include additional features as described with respect to FIG. 5D. For example, FIG. 5D depicts MAC units 562*a-c* and delay units 563*a-c* that may operate as described with respect MAC units 511a-c and delay units 513a-c of FIG. 5C. Accordingly, elements of FIG. 5D, whose numerical indicator is offset by 50 with respect to FIG. 5C, include similarly elements of the recurrent neural network 512; e.g., MAC unit 566a operates similarly with respect to MAC unit 516a. The system 550, including recurrent neural network 512, also includes additional features not highlighted in the recurrent neural network 512 of FIG. 5C. For example, the recurrent neural network 512 of FIG. 5D additionally includes MAC units 566c and 570b-c; delay units 567c and 571b-c; and MLUs 568c and 572b-c, such that the output data is provided as 575a-c, rather than as singularly in FIG. 5C as B(1) 530. Advantageously, the system 550 including a recurrent neural network 512 may process the input data 560a-c to generate the output data 575a-c with greater precision. For example, the recurrent neural network 512 may process the input data 560a-560c with additional coefficient retrieved at MLU 568c and multiplied and/or accumulated by additional MAC units 566c and 570b-c and additional delay units 567c and 571b-c, to generate output data 575a-c with greater precision. In implementations where board space (e.g., a printed circuit board) is not a primary factor in design, implementations of the recurrent neural network 512 of FIG. 5D may be desirable as compared to that of recurrent neural network 512 of FIG. 5C; which, in some implementations may occupy less board space as a result of having fewer elements than the recurrent neural network 512 of FIG. 5D.

Figure 5E:
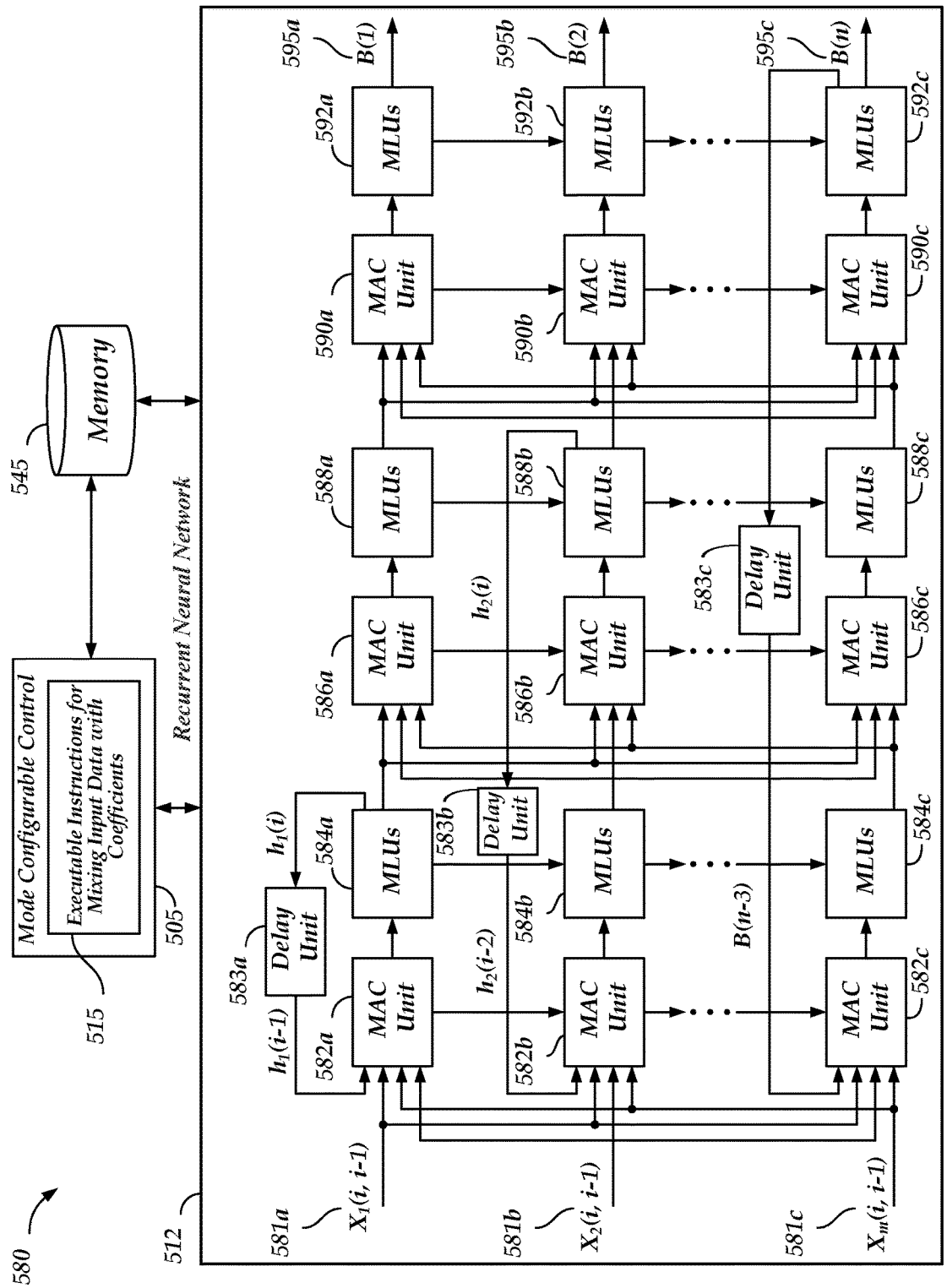

FIG. 5E is a schematic illustration of a recurrent neural network 512 arranged in a system 580 in accordance with examples described herein. Such a hardware implementation (e.g., system 580) may be used, for example, to implement one or more neural networks, such as the recurrent neural network 240 of FIG. 2, neural network 500 of FIG. 5A, or recurrent neural network 170 of FIG. 5B. Similarly described elements of FIG. 5E may operate as described with respect to FIG. 5D, except for the delay units 563a-c, 567a-c, and 571a-c of FIG. 5D. For example, FIG. 5E depicts MAC units 582a-c and delay units 583a-c that may operate as described with respect to MAC units 562a-c and delay units 563a-c of FIG. 5D. Accordingly, elements of FIG. 5E, whose numerical indicator is offset by 20 with respect to FIG. 5D, include similarly elements of the recurrent neural network 512; e.g., MAC unit 586a operates similarly with respect to MAC unit 566a.

The system 580, including recurrent neural network 512, also includes additional features not highlighted in the recurrent neural network 512 of FIG. 5D. Different than FIG. 5D, FIG. 5E depicts delay units 583a, 583b, and 583c. Accordingly, the processing unit of FIG. 5E illustrate that recurrent neural network 512 may include varying arrangements to the placement of the inputs and outputs of delay units, as illustrated with delay units 583a, 583b, and 583c. For example, the output of MLUs 588b may be provided to delay unit 583b, to generate a delayed version of that processing result from the second layer of MAC units, as an input to the first layer of MAC units, e.g., as an input to MAC unit 582b. Accordingly, the recurrent neural network 512 of system 580 is illustrative that delayed versions of processing results may be provided as inputs to other hidden layers, different than the recurrent neural network 512 of system 550 in FIG. 5D showing respective delayed versions being provided as inputs to the same layer in which those delayed versions were generated (e.g., the output of MLU 568b is provided to delay unit 567b, to generate a delayed version for the MAC unit 566b in the same layer from which the processing result was outputted). Therefore, in the example, even the output B(n) 595c may be provided, from the last hidden layer, to the first hidden layer (e.g., as an input to MAC unit 582c).

Advantageously, such delayed versions of processing results, which may be provided as inputs to different or additional hidden layers, may better compensate "higher-order" memory effects in a recurrent neural network 170 that implements one or more recurrent neural network 512 of FIG. 5E, e.g., as compared to the recurrent neural network 512 of FIG. 5C or 5D. For example, higher-order memory effects model the effects of leading and lagging envelope signals used during training of the recurrent neural network 170, to provide output data that estimates a vector representative of nonlinear power amplifier noise. In the example, a recurrent neural network 170 that estimates that vector (e.g., a Volterra series model) may include varying delayed versions of processing results that corresponds to such leading and lagging envelopes (e.g., of various envelopes encapsulating the vector). Accordingly, implementing the recurrent neural network 512 incorporates such higher-order memory effects, e.g., for an inference of a recurrent neural network 170, to provide output data 595a-c based on input data 581a-c.

While described in FIGS. 5D and 5E respectively describe a recurrent neural network 512, it can be appreciated that the recurrent neural network 512 or combinations thereof may be implemented in or as any of the recurrent neural networks described herein, in operation to cancel and/or compensate nonlinear power amplifier noise via the calculation of such noise as implemented in a recurrent neural network. In such implementations, recurrent neural networks may be used to reduce and/or improve errors which may be introduced by nonlinear power amplifier noise. Advantageously, with such an implementation, wireless systems and devices implementing such RNNs may increase capacity of their respective wireless networks because additional data may be transmitted in such networks, which would not otherwise be transmitted due to the effects of nonlinear power amplifier noise.

Figure 6:
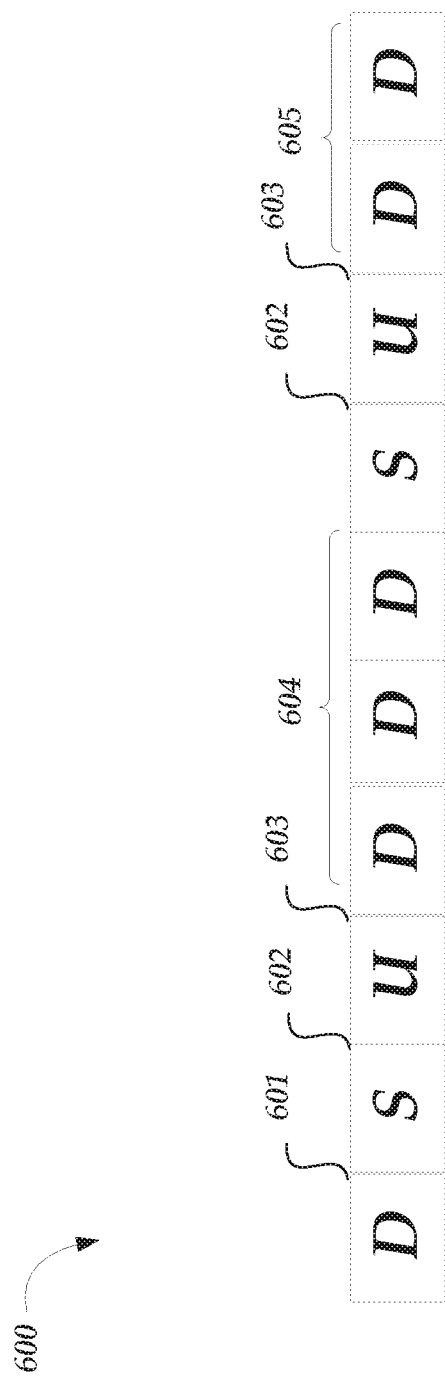
FIG. 6 is a schematic illustration of a time frame for a time-division multiplexing time period arranged in accordance with examples described herein.

FIG. 6 is a schematic illustration of a time frame 600 for a TDD transmission time interval (TTI) arranged in accordance with examples described herein. The time frame 600 includes downlink TTIs 601, 604, and 605. The time frame also includes uplink TTIs 603. The time frame 600 also includes special time frames 602, which may include additional uplink and/or downlink TTIs for special TDD time periods. For example, a special time period may be allocated in the time frame 600 for specific functionalities of a wireless protocol, such as signaling/handshaking. The downlink TTIs may be of varying time period lengths, as depicted, with the downlink TTI 604 being thrice as long as the downlink TTI 601.

The time frame 600 may be utilized in time-division duplexing configured radio frames for electronic devices described herein. For example, with respect to the electronic device 200, the switch 245 activates a path to provide the feedback signal X(n) 277 through the wireless receiver path to the recurrent neural network 280, when the wireless receiver path is not receiving an active wireless signal. For example, the wireless receiver path may not receive an active wireless signal during the uplink TTIs 603. Accordingly, during the uplink TTIs 603, the switch 245 may be activated to provide the feedback signal X(n) 277 through the wireless receiver path to the recurrent neural network 280. In providing the feedback over multiple uplink TTIs 603, the recurrent neural network 280 may provide the coefficients data of a model that at least partially compensate for nonlinear power amplifier noise. Additionally or alternatively, during at least a portion of downlink TTIs 601, 604, and 605, the switch may deactivate the path that provides feedback signal X(n) 277 through the wireless receiver path, so that the wireless receiver portion of a wireless transceiver may receive wireless transmission signals R(n) 257, thereby providing for efficient TDD configured radio frames to both provide the feedback signal X(n) 277 to the recurrent neural network 280 and to receive wireless signals R(n) 257 using the same wireless receiver path.

Figure 7A:
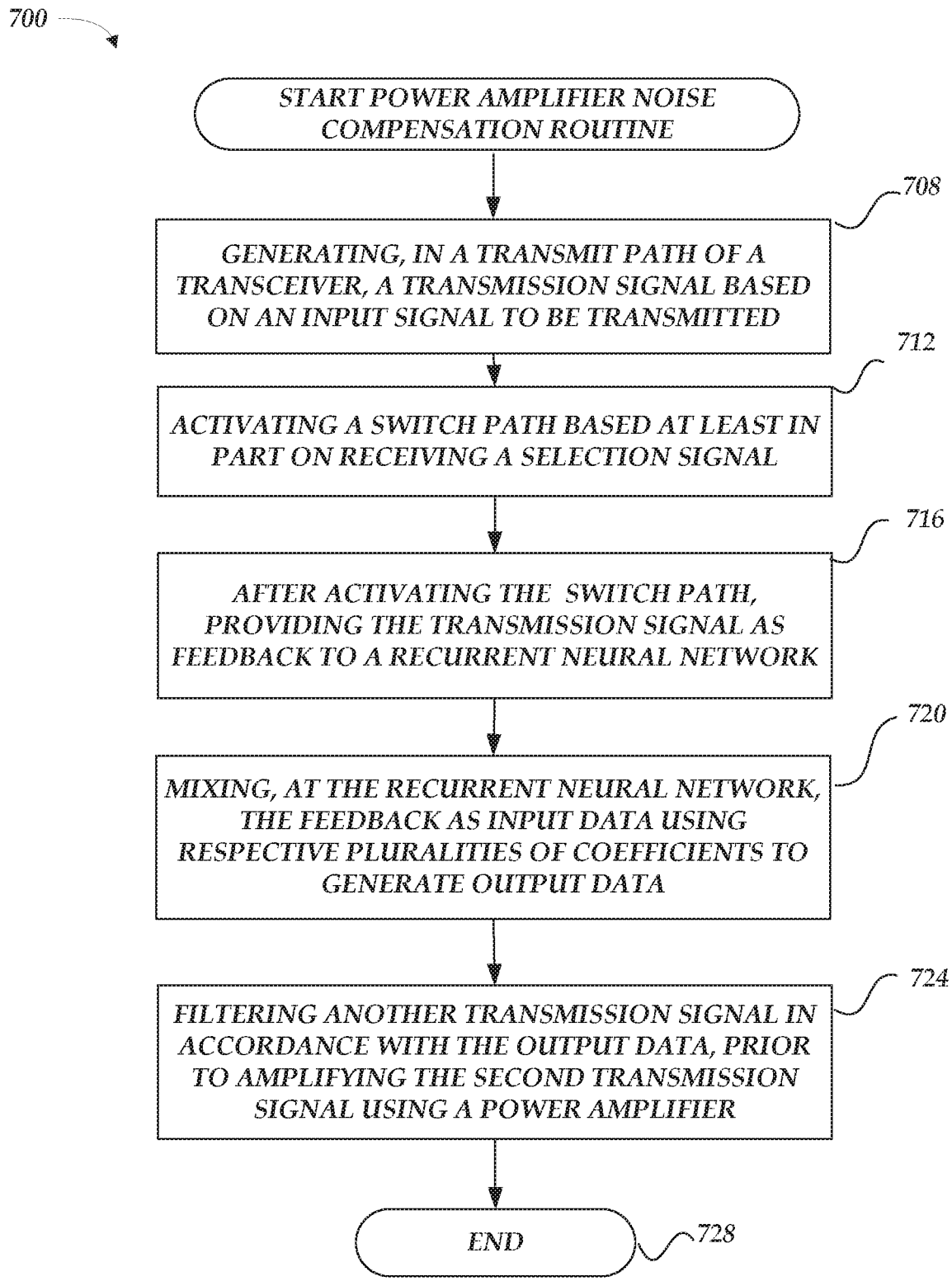
FIG. 7A is a schematic illustration of a power amplifier noise compensation method in accordance with examples described herein.

FIG. 7A is a schematic illustration of a power amplifier noise compensation method 700 in accordance with examples described herein. Example method 700 may be implemented using, for example, electronic device 102, 110 of FIG. 1, electronic device 200 of FIG. 2, recurrent neural network 512 of FIGS. 5C-5E, electronic device 800 of FIG. 8, or any system or combination of the systems depicted in the Figures described herein, such as in conjunction with a time frame 600 of FIG. 6. The operations described in blocks 708-728 may also be stored as computer-executable instructions in a computer-readable medium.

Example method 700 may begin with block 708 that starts execution of the power amplifier noise compensation method and includes generating, in a transmit path of a transceiver, a transmission signal based on an input signal to be transmitted. In the example, a transceiver includes transmit and receive paths from respective transmitting and receiving antennas, such as the electronic device 200. In context of FIG. 2, the signal to be transmitted T(n) 247 is provided, in a transmit path of the electronic device 200, to the transmitting antenna 250 through a power amplifier 240. Accordingly, in generating the transmission signal based on the transmission signal, the signal to be transmitted T(n) 247 is amplified by the power amplifier 240, which introduces nonlinear power amplifier noise into the signal to be transmitted T(n) 247.

Block 708 may be followed by block 712, such that the method further includes activating, a switch path based at least in part on receiving a selection signal. The transmit path to the transmitting antenna 250 includes a path through the switch 245 for transmission of any signal to be transmitted. For example, to activate the switch 245, the switch 245 receives a selection signal that indicates the switch path is to be activated when a transmission time interval (TTI) of a time-division duplex (TDD) configured radio frame is designated for an uplink transmission. When the switch 245 is activated, the receive path of the transceiver is coupled to the transmit path of the transceiver. Accordingly, that same amplified signal to be transmitted T(n) 247 is provided to a receive path via the switch 245, when the switch 245 is activated, as the signal X(n) 249.

Block 712 may be followed by block 716, such that the method further includes, after activating the switch path, providing the transmission signal as feedback to a recurrent neural network. In the context of FIG. 2, after processing of the signal X(n) 249, a feedback signal X(n) 277 is provided to the recurrent neural network 280. For example, with the switch 245 having been activated, the receive path of the transceiver is coupled to the transmit path of the transceiver. Accordingly, the same signal that is provided as the transmission signal T(n) 247 to the antenna 250 is also provided to the receive path of the transceiver, e.g., beginning at the LNA 260.

Block 716 may be followed by block 720, such that the method further includes mixing, at the recurrent neural network, the feedback as input data using respective pluralities of coefficients to generate output data. For example, various ALUs, such as multiplication/accumulation processing units, may be configured to operate as the circuitry of FIGS. 5C-5E. Accordingly, to mix the feedback signal X(n) 277, a recurrent neural network receives the feedback signal X(n) 277 as input data (e.g., input data 510a, 510b, and 510c). In some implementations, the recurrent neural network 280 may implement the method 700 such that the recurrent neural network calculates first processing results based on the input data and delayed versions of respective outputs of a first layer of multiplication/accumulation processing units (MAC units) with the plurality of coefficients; and calculates output data based on the first processing results and delayed versions of respective outputs of a respective additional layer of MAC units with the additional plurality of coefficients. In mixing the feedback signal X(n) 277 as input data using respective pluralities of coefficients at the recurrent neural network 280, output data is generated to be utilized as filter coefficient data in DPD filter 220 (e.g., as a model for at least partially compensating nonlinear power amplifier noise).

Block 720 may be followed by block 724, such that the method further includes filtering another transmission signal in accordance with the output data, prior to amplifying the second transmission signal using a power amplifier. To filter another transmission signal in accordance with the output data, the output data is provided, from the recurrent neural network 280, as filter coefficient data to the DPD filter 220 that at least partially compensates for nonlinear power amplifier noise in additional transmission signals to be transmitted by the electronic device 200. Accordingly, when an additional signal to be transmitted t(n) 210 is to be transmitted in the electronic device 200, the DPD filter 220 filters the transmission signal in accordance with the output data that was provided as filter coefficient data to the DPD filter 220 from the recurrent neural network 280, prior to amplifying that transmission signal using the power amplifier 240. Block 724 may be followed by block 728 that ends the example method 700.

The blocks included in the described example method 700 is for illustration purposes. In some embodiments, these blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Figure 7B:
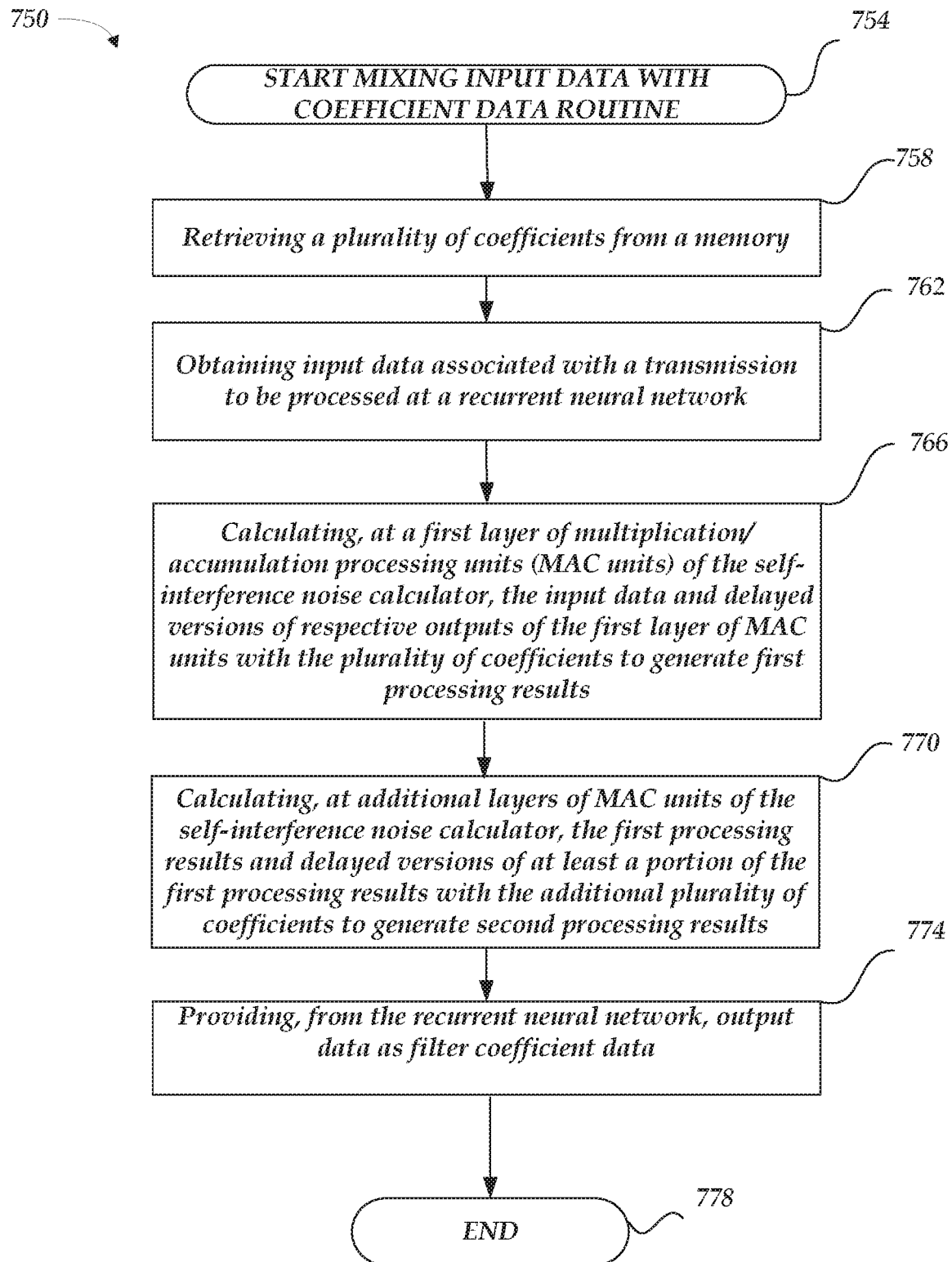
FIG. 7B is a flowchart of a method in accordance with examples described herein.

FIG. 7B is a flowchart of a method 750 in accordance with examples described herein. Example method 750 may be implemented using, for example, electronic device 102, 110 of FIG. 1, electronic device 200 of FIG. 2, recurrent neural network 512 of FIGS. 5C-5E, electronic device 800 of FIG. 8, or any system or combination of the systems depicted in the Figures described herein, such as in conjunction with a time frame 600 of FIG. 6. The operations described in blocks 754-778 may also be stored as computer-executable instructions in a computer-readable medium such as the mode configurable control 505, storing the executable instructions 515.

Example method 750 may begin with a block 754 that starts execution of the mixing input data with coefficient data routine. The method may include a block 758 recites "retrieving a plurality of coefficients from a memory." As described herein, a memory look-up (MLU) units can be configured to retrieve a plurality of coefficients and provide the plurality of coefficients as the connection weights for a respective layer of processing elements of a recurrent neural network. For example, the memory may store (e.g., in a database) a plurality of coefficients representative of nonlinear power amplifier noise. In the implementation of recurrent neural network 512 of FIG. 5C, for example, the MLU 514a can be a table look-up that retrieves one or more pluralities of coefficients to be applied to both operands M and N, as well as an additional coefficient to be applied to operand T. Accordingly, MLUs of the recurrent neural network may request the pluralities of coefficients from a memory part of the implementing computing device, from a memory part of an external computing device, or from a memory implemented in a cloud-computing device. In turn, the plurality of coefficients may be retrieved from the memory as utilized by the recurrent neural network.

Block 758 may be followed by block 762 that recites "obtaining input data associated with a transmission to be processed at a recurrent neural network." The input data may correspond to amplified signals x1(n), x2(n) 221, 223 that is received as input data at a recurrent neural network 240 or any of the recurrent neural networks described herein. Block 762 may be followed by block 766 that recites "calculating, at a first layer of multiplication/accumulation processing units (MAC units) of the recurrent neural network, the input data and delayed versions of respective outputs of the first layer of MAC units with the plurality of coefficients to generate first processing results." As described herein, the recurrent neural network utilizes the plurality of coefficients such that mixing the coefficients with input data and delayed versions of respective outputs of the first layer of MAC units generates output data that reflects the processing of the input data with coefficients by the circuitry of FIG. 5C, 5D, or 5E. For example, various ALUs in an integrated circuit may be configured to operate as the circuitry of FIG. 5C, 5D, or 5E, thereby mixing the input data and delayed versions of respective outputs of the first layer of MAC units with the coefficients as described herein. For example, with reference to FIG. 5C, the input data and delayed versions of respective outputs of the first layer of MAC units may be calculated with the plurality of coefficients to generate first processing results, at a first layer of multiplication/accumulation processing units (MAC units). In some examples, various hardware platforms may implement the circuitry of FIG. 5C, 5D, or 5E, such as an ASIC, a DSP implemented as part of a FPGA, or a system-on-chip.

Block 766 may be followed by block 770 that recites "calculating, at additional layers of MAC units, the first processing results and delayed versions of at least a portion of the first processing results with the additional plurality of coefficients to generate second processing results." As described herein, the recurrent neural network utilizes additional plurality of coefficients such that mixing the coefficients with certain processing results and delayed versions of at least a portion of those certain processing results generates output data that reflects the processing of the input data with coefficients by the circuitry of FIG. 5C, 5D, or 5E. For example, with reference to FIG. 5C, the processing results of the first layer (e.g., multiplication processing results) and delayed versions of at least a portion of those processing results may be calculated with the additional plurality of coefficients to generate second processing results, at a second layer of multiplication/accumulation processing units (MAC units). The processing results of the second layer may be calculated with an additional plurality of coefficients to generate the output data B(1) 530.

Block 770 may be followed by block 774 that recites "providing, from the recurrent neural network, output data as filter coefficient data." As described herein, the output data may be provided from the recurrent neural network 280 to the DPD filter 220 to compensate or reduce nonlinear power amplifier noise. Advantageously, output data from a recurrent neural network 280 (e.g., y1(n), y2(n), y3(n), yL(n) 508) based at least partly on the feedback signal X(n) 277 is utilized by the DPD filter 220, as filter coefficient data, e.g., prior to input of additional input signals to be transmitted to a power amplifier. Accordingly, a wireless device or system that implements the method 750 may compensate or reduce nonlinear power amplifier noise introduced by the power amplifier 240. Block 774 may be followed by block 778 that ends the example method 750.

The blocks included in the described example methods 700 and 750 are for illustration purposes. In some embodiments, these blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Figure 8:
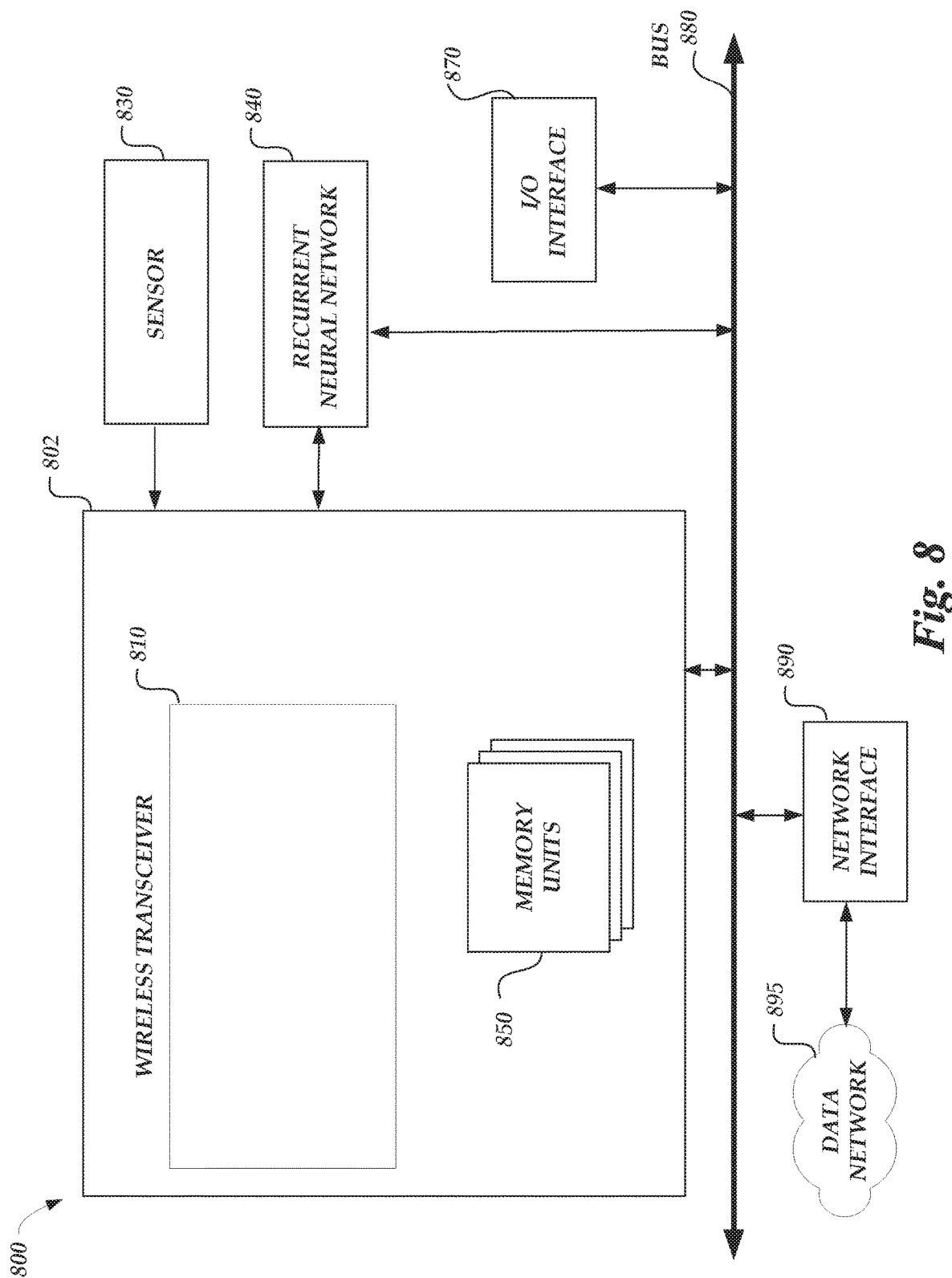
FIG. 8 is a block diagram of a computing device arranged in accordance with examples described herein.

FIG. 8 is a block diagram of an electronic device 800 arranged in accordance with examples described herein. The electronic device 800 may operate in accordance with any example described herein, such as electronic device 102, 110 of FIG. 1, electronic device 200 of FIG. 2, recurrent neural network 512 of FIG. 5C-5E, or any system or combination of the systems depicted in the Figures described herein, such as in conjunction with a time frame 600 of FIG. 6. The electronic device 800 may be implemented in a smartphone, a wearable electronic device, a server, a computer, an appliance, a vehicle, or any type of electronic device. For example, FIGS. 9-12 describe various devices that may be implemented as the electronic device 800 using a recurrent neural network 840 to make inference results or train on data acquired from the sensor 830. Generally, recurrent neural networks (e.g., recurrent neural network 840) may make inference results based on data acquired from the sensor 830. For example, in addition to using a RNN for compensating or reducing nonlinear power amplifier noise, an electronic device 800 may use an RNN to make inference results regarding datasets acquired via a sensor 830 or via a data network 895. Making an inference results may include determining a relationship among one or more datasets, among one or more subsets of a dataset, or among different subsets of various datasets. For example, a determined relationship may be represented as an AI model that the RNN generates. Such a generated AI model may be utilized to make predictions about similar datasets or similar subsets of a dataset, when provided as input to such an AI model. As one skilled in the art can appreciate, various types of inference results may be made by a RNN, which could include generating one or more AI models regarding acquired datasets.

The sensor 830 included in the electronic device 800 may be any sensor configured to detect an environmental condition and quantify a measurement parameter based on that environmental condition. For example, the sensor 830 may be a photodetector that detects light and quantifies an amount or intensity of light that is received or measured at the sensor 830. A device with a sensor 830 may be referred to as a sensor device. Examples of sensor devices include sensors for detecting energy, heat, light, vibration, biological signals (e.g., pulse, EEG, EKG, heart rate, respiratory rate, blood pressure), distance, speed, acceleration, or combinations thereof. Sensor devices may be deployed on buildings, individuals, and/or in other locations in the environment. The sensor devices may communicate with one another and with computing systems which may aggregate and/or analyze the data provided from one or multiple sensor devices in the environment.

The electronic device 800 includes a computing system 802, a recurrent neural network 840, an I/O interface 870, and a network interface 890 coupled to a data network 895. The data network 895 may include a network of data devices or systems such as a data center or other electronic devices 800 that facilitate the acquisition of data sets or communicate inference results among devices coupled to the data network 895. For example, the electronic device 800 may communicate inference results about nonlinear power amplifier noise, which are calculated at the recurrent neural network 840, to communicate such inference results to other electronic devices 800 with a similar connection or to a data center where such inference results may be utilized as part of a data set, e.g., for further training in a machine learning or AI system. Accordingly, in implementing the recurrent neural network 840 in the electronic device 800, mobile and sensor devices that operate as the electronic device 800 may facilitate a fast exchange of inference results or large data sets that are communicated to data center for training or inference.

The computing system 802 includes a wireless transceiver 810. The wireless transceiver may include a wireless transmitter and/or wireless receiver, such as wireless transmitter 300 and wireless receiver 400. Recurrent neural network 840 may include any type of microprocessor, central processing unit (CPU), an application specific integrated circuits (ASIC), a digital signal processor (DSP) implemented as part of a field-programmable gate array (FPGA), a system-on-chip (SoC), or other hardware to provide processing for device 800.

The computing system 802 includes memory units 850 (e.g., memory look-up unit), which may be non-transitory hardware readable medium including instructions, respectively, for calculating filter coefficient data or be memory units for the retrieval, calculation, or storage of filter coefficient data. The memory units 850 may be utilized to store data sets from machine learning or A techniques executed by the electronic device 800. The memory units 850 may also be utilized to store, determine, or acquire inference results for machine learning or AI techniques executed by the electronic device 800. In some examples, the memory units 850 may include one or more types of memory, including but not limited to: DRAM, SRAM, NAND, or 3D XPoint memory devices.

The computing system 802 may include control instructions that indicate when to execute such stored instructions for calculating filter coefficient data or for the retrieval or storage of filter coefficient data. Upon receiving such control instructions, the recurrent neural network 840 may execute such control instructions and/or executing such instructions with elements of computing system 802 (e.g., wireless transceiver 810) to perform such instructions. For example, such instructions may include a program that executes the method 700, a program that executes the method 750, or a program that executes both methods 700 and 750. In some implementations, the control instructions include memory instructions for the memory units 850 to interact with the recurrent neural network 840. For example, the control instructions may include an instruction that, when executed, facilitates the provision of a read request to the memory units 850 to access (e.g., read) a large dataset, such as one or more feedback signals X(n) 277, to determine an inference result. As another example, the control instructions may include an instruction that, when executed, facilitates the provision of a write request to the memory units 850 to write a data set that the electronic device 800 has acquired, e.g., via the sensor 830 or via the I/O interface 870. Control instructions may also include instructions for the memory units 850 to communicate data sets or inference results to a data center via data network 895. For example, a control instruction may include an instruction that memory units 850 write data sets or inference results about nonlinear power amplifier noise, which are calculated at the recurrent neural network 840, to a cloud server at a data center where such inference results may be utilized as part of a data set, e.g., for further training in a machine learning or AI system or for the processing of further communication signals (e.g., filter coefficient data for the RNN 280).

Communications between the recurrent neural network 840, the I/O interface 870, and the network interface 890 may be provided via an internal bus 880. The recurrent neural network 840 may receive control instructions from the I/O interface 870 or the network interface 890, such as instructions to determine and provide filter coefficient data to a digital pre-distortion filter (e.g., DPD filter 220). For example, the I/O interface 870 may facilitate a connection to a camera device that obtain images and communicates such images to the electronic device 800 via the I/O interface 870.

Bus 880 may include one or more physical buses, communication lines/interfaces, and/or point-to-point connections, such as Peripheral Component Interconnect (PCI) bus, a Gen-Z switch, a CCIX interface, or the like. The I/O interface 870 can include various user interfaces including video and/or audio interfaces for the user, such as a tablet display with a microphone. Network interface 890 communications with other electronic devices, such as electronic device 800 or a cloud-electronic server, over the data network 895. For example, the network interface 890 may be a USB interface.

Figure 9:
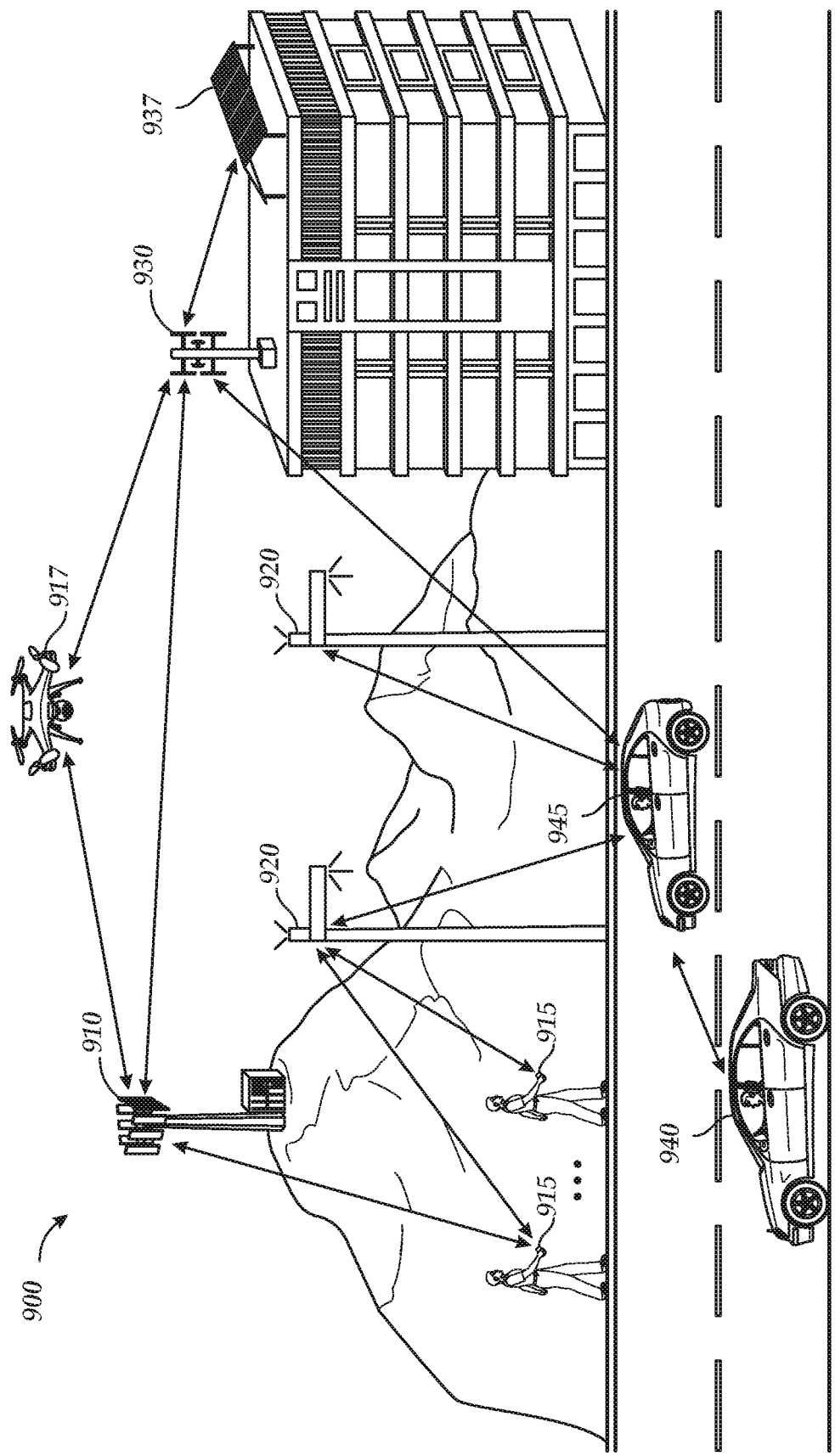
FIG. 9 is a schematic illustration of a wireless communications system arranged in accordance with aspects of the present disclosure.

FIG. 9 illustrates an example of a wireless communications system 900 in accordance with aspects of the present disclosure. The wireless communications system 900 includes a base station 910, a mobile device 915, a drone 917, a small cell 930, and vehicles 940, 945. The base station 910 and small cell 930 may be connected to a network that provides access to the Internet and traditional communication links. The system 900 may facilitate a wide-range of wireless communications connections in a 5G system that may include various frequency bands, including but not limited to: a sub-6 GHz band (e.g., 700 MHz communication frequency), mid-range communication bands (e.g., 2.4 GHz), mmWave bands (e.g., 24 GHz), and a NR band (e.g., 3.5 GHz).

Additionally or alternatively, the wireless communications connections may support various modulation schemes, including but not limited to: filter bank multi-carrier (FBMC), the generalized frequency division multiplexing (GFDM), universal filtered multi-carrier (UFMC) transmission, bi-orthogonal frequency division multiplexing (BFDM), sparse code multiple access (SCMA), non-orthogonal multiple access (NOMA), multi-user shared access (MUSA), and faster-than-Nyquist (FTN) signaling with time-frequency packing. Such frequency bands and modulation techniques may be a part of a standards framework, such as Long Term Evolution (LTE) (e.g., 1.8 GHz band) or other technical specification published by an organization like 3GPP or IEEE, which may include various specifications for subcarrier frequency ranges, a number of subcarriers, uplink/downlink transmission speeds, TDD/FDD, and/or other aspects of wireless communication protocols.

The system 900 may depict aspects of a radio access network (RAN), and system 900 may be in communication with or include a core network (not shown). The core network may include one or more serving gateways, mobility management entities, home subscriber servers, and packet data gateways. The core network may facilitate user and control plane links to mobile devices via the RAN, and it may be an interface to an external network (e.g., the Internet). Base stations 910, communication devices 920, and small cells 930 may be coupled with the core network or with one another, or both, via wired or wireless backhaul links (e.g., S1 interface, X2 interface, etc.).

The system 900 may provide communication links connected to devices or "things," such as sensor devices, e.g., solar cells 937, to provide an Internet of Things ("IoT") framework. Connected things within the IoT may operate within frequency bands licensed to and controlled by cellular network service providers, or such devices or things may. Such frequency bands and operation may be referred to as narrowband IoT (NB-IoT) because the frequency bands allocated for IoT operation may be small or narrow relative to the overall system bandwidth. Frequency bands allocated for NB-IoT may have bandwidths of, 50, 100, 150, or 200 kHz, for example.

Additionally or alternatively, the IoT may include devices or things operating at different frequencies than traditional cellular technology to facilitate use of the wireless spectrum. For example, an IoT framework may allow multiple devices in system 900 to operate at a sub-6 GHz band or other industrial, scientific, and medical (ISM) radio bands where devices may operate on a shared spectrum for unlicensed uses. The sub-6 GHz band may also be characterized as and may also be characterized as an NB-IoT band. For example, in operating at low frequency ranges, devices providing sensor data for "things," such as solar cells 937, may utilize less energy, resulting in power-efficiency and may utilize less complex signaling frameworks, such that devices may transmit asynchronously on that sub-6 GHz band. The sub-6 GHz band may support a wide variety of uses case, including the communication of sensor data from various sensors devices. Examples of sensor devices include sensors for detecting energy, heat, light, vibration, biological signals (e.g., pulse, EEG, EKG, heart rate, respiratory rate, blood pressure), distance, speed, acceleration, or combinations thereof. Sensor devices may be deployed on buildings, individuals, and/or in other locations in the environment. The sensor devices may communicate with one another and with computing systems which may aggregate and/or analyze the data provided from one or multiple sensor devices in the environment.

In such a 5G framework, devices may perform functionalities performed by base stations in other mobile networks (e.g., UMTS or LTE), such as forming a connection or managing mobility operations between nodes (e.g., handoff or reselection). For example, mobile device 915 may receive sensor data from the user utilizing the mobile device 915, such as blood pressure data, and may transmit that sensor data on a narrowband IoT frequency band to base station 910. In such an example, some parameters for the determination by the mobile device 915 may include availability of licensed spectrum, availability of unlicensed spectrum, and/or time-sensitive nature of sensor data. Continuing in the example, mobile device 915 may transmit the blood pressure data because a narrowband IoT band is available and can transmit the sensor data quickly, identifying a time-sensitive component to the blood pressure (e.g., if the blood pressure measurement is dangerously high or low, such as systolic blood pressure is three standard deviations from norm).

Additionally or alternatively, mobile device 915 may form device-to-device (D2D) connections with other mobile devices or other elements of the system 900. For example, the mobile device 915 may form RFID, WiFi, MultiFire, Bluetooth, or Zigbee connections with other devices, including communication device 920 or vehicle 945. In some examples, D2D connections may be made using licensed spectrum bands, and such connections may be managed by a cellular network or service provider. Accordingly, while the above example was described in the context of narrowband IoT, it can be appreciated that other device-to-device connections may be utilized by mobile device 915 to provide information (e.g., sensor data) collected on different frequency bands than a frequency band determined by mobile device 915 for transmission of that information.

Moreover, some communication devices may facilitate ad-hoc networks, for example, a network being formed with communication devices 920 attached to stationary objects and the vehicles 940, 945, without a traditional connection to a base station 910 and/or a core network necessarily being formed. Other stationary objects may be used to support communication devices 920, such as, but not limited to, trees, plants, posts, buildings, blimps, dirigibles, balloons, street signs, mailboxes, or combinations thereof. In such a system 900, communication devices 920 and small cell 930 (e.g., a small cell, femtocell, WLAN access point, cellular hotspot, etc.) may be mounted upon or adhered to another structure, such as lampposts and buildings to facilitate the formation of ad-hoc networks and other IoT-based networks. Such networks may operate at different frequency bands than existing technologies, such as mobile device 915 communicating with base station 910 on a cellular communication band.

The communication devices 920 may form wireless networks, operating in either a hierarchal or ad-hoc network fashion, depending, in part, on the connection to another element of the system 900. For example, the communication devices 920 may utilize a 700 MHz communication frequency to form a connection with the mobile device 915 in an unlicensed spectrum, while utilizing a licensed spectrum communication frequency to form another connection with the vehicle 945. Communication devices 920 may communicate with vehicle 945 on a licensed spectrum to provide direct access for time-sensitive data, for example, data for an autonomous driving capability of the vehicle 945 on a 5.9 GHz band of Dedicated Short Range Communications (DSRC).

Vehicles 940 and 945 may form an ad-hoc network at a different frequency band than the connection between the communication device 920 and the vehicle 945. For example, for a high bandwidth connection to provide time-sensitive data between vehicles 940, 945, a 24 GHz mmWave band may be utilized for transmissions of data between vehicles 940, 945. For example, vehicles 940, 945 may share real-time directional and navigation data with each other over the connection while the vehicles 940, 945 pass each other across a narrow intersection line. Each vehicle 940, 945 may be tracking the intersection line and providing image data to an image processing algorithm to facilitate autonomous navigation of each vehicle while each travels along the intersection line. In some examples, this real-time data may also be substantially simultaneously shared over an exclusive, licensed spectrum connection between the communication device 920 and the vehicle 945, for example, for processing of image data received at both vehicle 945 and vehicle 940, as transmitted by the vehicle 940 to vehicle 945 over the 24 GHz mmWave band. While shown as automobiles in FIG. 9, other vehicles may be used including, but not limited to, aircraft, spacecraft, balloons, blimps, dirigibles, trains, submarines, boats, ferries, cruise ships, helicopters, motorcycles, bicycles, drones, or combinations thereof.

While described in the context of a 24 GHz mmWave band, it can be appreciated that connections may be formed in the system 900 in other mmWave bands or other frequency bands, such as 28 GHz, 37 GHz, 38 GHz, 39 GHz, which may be licensed or unlicensed bands. In some cases, vehicles 940, 945 may share the frequency band that they are communicating on with other vehicles in a different network. For example, a fleet of vehicles may pass vehicle 940 and, temporarily, share the 24 GHz mmWave band to form connections among that fleet, in addition to the 24 GHz mmWave connection between vehicles 940, 945. As another example, communication device 920 may substantially simultaneously maintain a 700 MHz connection with the mobile device 915 operated by a user (e.g., a pedestrian walking along the street) to provide information regarding a location of the user to the vehicle 945 over the 5.9 GHz band. In providing such information, communication device 920 may leverage antenna diversity schemes as part of a massive MIMO framework to facilitate time-sensitive, separate connections with both the mobile device 915 and the vehicle 945. A massive MIMO framework may involve a transmitting and/or receiving devices with a large number of antennas (e.g., 12, 20, 64, 128, etc.), which may facilitate precise beamforming or spatial diversity unattainable with devices operating with fewer antennas according to legacy protocols (e.g., WiFi or LTE).

The base station 910 and small cell 930 may wirelessly communicate with devices in the system 900 or other communication-capable devices in the system 900 having at the least a sensor wireless network, such as solar cells 937 that may operate on an active/sleep cycle, and/or one or more other sensor devices. The base station 910 may provide wireless communications coverage for devices that enter its coverages area, such as the mobile device 915 and the drone 917. The small cell 930 may provide wireless communications coverage for devices that enter its coverage area, such as near the building that the small cell 930 is mounted upon, such as vehicle 945 and drone 917.

Generally, a small cell 930 may be referred to as a small cell and provide coverage for a local geographic region, for example, coverage of 200 meters or less in some examples. This may contrasted with at macrocell, which may provide coverage over a wide or large area on the order of several square miles or kilometers. In some examples, a small cell 930 may be deployed (e.g., mounted on a building) within some coverage areas of a base station 910 (e.g., a macrocell) where wireless communications traffic may be dense according to a traffic analysis of that coverage area. For example, a small cell 930 may be deployed on the building in FIG. 9 in the coverage area of the base station 910 if the base station 910 generally receives and/or transmits a higher amount of wireless communication transmissions than other coverage areas of that base station 910. A base station 910 may be deployed in a geographic area to provide wireless coverage for portions of that geographic area. As wireless communications traffic becomes more dense, additional base stations 910 may be deployed in certain areas, which may alter the coverage area of an existing base station 910, or other support stations may be deployed, such as a small cell 930.

Small cell 930 may be a femtocell, which may provide coverage for an area smaller than a small cell (e.g., 100 meters or less in some examples (e.g., one story of a building)).

While base station 910 and small cell 930 may provide communication coverage for a portion of the geographical area surrounding their respective areas, both may change aspects of their coverage to facilitate faster wireless connections for certain devices. For example, the small cell 930 may primarily provide coverage for devices surrounding or in the building upon which the small cell 930 is mounted. However, the small cell 930 may also detect that a device has entered is coverage area and adjust its coverage area to facilitate a faster connection to that device.

For example, a small cell 930 may support a massive MIMO connection with the drone 917, which may also be referred to as an unmanned aerial vehicle (UAV), and, when the vehicle 945 enters it coverage area, the small cell 930 adjusts some antennas to point directionally in a direction of the vehicle 945, rather than the drone 917, to facilitate a massive MIMO connection with the vehicle, in addition to the drone 917. In adjusting some of the antennas, the small cell 930 may not support as fast as a connection to the drone 917 at a certain frequency, as it had before the adjustment. For example, the small cell 930 may be communicating with the drone 917 on a first frequency of various possible frequencies in a 4G LTE band of 1.8 GHz. However, the drone 917 may also request a connection at a different frequency with another device (e.g., base station 910) in its coverage area that may facilitate a similar connection as described with reference to the small cell 930, or a different (e.g., faster, more reliable) connection with the base station 910, for example, at a 3.5 GHz frequency in the 5G NR band. In some examples, drone 917 may serve as a movable or aerial base station. Accordingly, the system 900 may enhance existing communication links in compensating, at least partially, nonlinear power amplifier devices for devices that include power amplifiers, for example, in both the 4GE LTE and 5G NR bands.

The wireless communications system 900 may include devices such as base station 910, communication device 920, and small cell 930 that may support several connections at varying frequencies to devices in the system 900, while also at least partially compensating for nonlinear power amplifier noise utilizing recurrent neural networks, such as recurrent neural network 280. Such devices may operate in a hierarchal mode or an ad-hoc mode with other devices in the network of system 900. While described in the context of a base station 910, communication device 920, and small cell 930, it can be appreciated that other devices that can support several connections with devices in the network, while also at least partially compensating for nonlinear power amplifier noise utilizing recurrent neural networks, may be included in system 900, including but not limited to: macrocells, femtocells, routers, satellites, and RFID detectors.

In various examples, the elements of wireless communication system 900, such as base station 910, a mobile device 915, a drone 917, communication device 920, a small cell 930, and vehicles 940, 945, may be implemented as an electronic device described herein that at least partially compensate for nonlinear power amplifier noise utilizing recurrent neural networks. For example, the communication device 920 may be implemented as electronic devices described herein, such as electronic device 102, 110 of FIG. 1, electronic device 200 of FIG. 2, recurrent neural network 512 of FIGS. 5C-5E, electronic device 800 of FIG. 8, or any system or combination of the systems depicted in the Figures described herein, such as in conjunction with a time frame 600 of FIG. 6.

Figure 10:
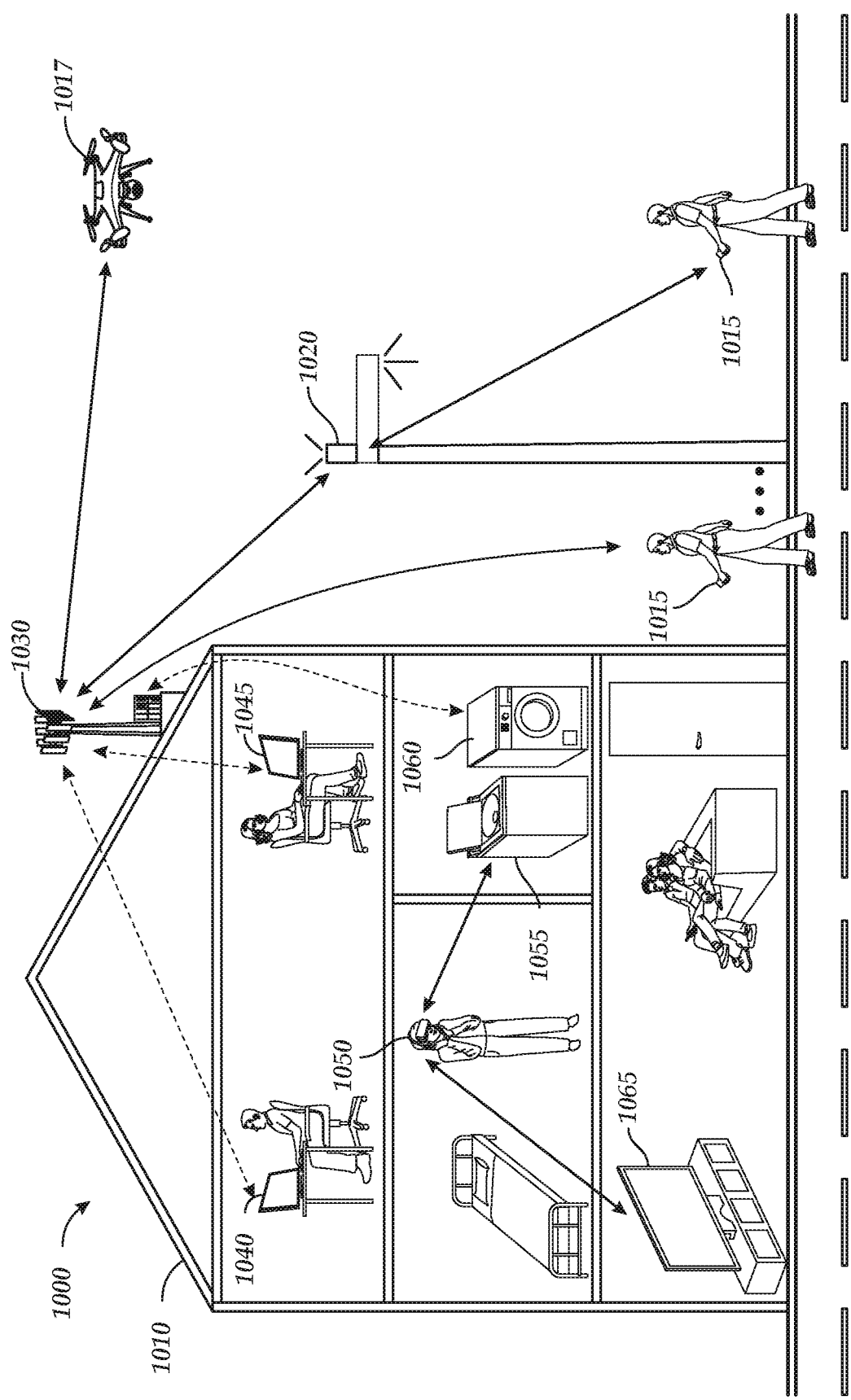
FIG. 10 is a schematic illustration of a wireless communications system arranged in accordance with aspects of the present disclosure.

FIG. 10 illustrates an example of a wireless communications system 1000 in accordance with aspects of the present disclosure. The wireless communications system 1000 includes a mobile device 1015, a drone 1017, a communication device 1020, and a small cell 1030. A building 1010 also includes devices of the wireless communication system 1000 that may be configured to communicate with other elements in the building 1010 or the small cell 1030. The building 1010 includes networked workstations 1040, 1045, virtual reality device 1050, IoT devices 1055, 1060, and networked entertainment device 1065. In the depicted system 1000, IoT devices 1055, 1060 may be a washer and dryer, respectively, for residential use, being controlled by the virtual reality device 1050. Accordingly, while the user of the virtual reality device 1050 may be in different room of the building 1010, the user may control an operation of the IoT device 1055, such as configuring a washing machine setting. Virtual reality device 1050 may also control the networked entertainment device 1065. For example, virtual reality device 1050 may broadcast a virtual game being played by a user of the virtual reality device 1050 onto a display of the networked entertainment device 1065.

The small cell 1030 or any of the devices of building 1010 may be connected to a network that provides access to the Internet and traditional communication links. Like the system 900, the system 1000 may facilitate a wide-range of wireless communications connections in a 5G system that may include various frequency bands, including but not limited to: a sub-6 GHz band (e.g., 700 MHz communication frequency), mid-range communication bands (e.g., 2.4 GHz), mmWave bands (e.g., 24 GHz), or any other bands, such as a 1 MHz, 5 MHz, 10 MHz, 20 MHz band. Additionally or alternatively, the wireless communications connections may support various modulation schemes as described above with reference to system 900. System 1000 may operate and be configured to communicate analogously to system 900. Accordingly, similarly numbered elements of system 1000 and system 900 may be configured in an analogous way, such as communication device 920 to communication device 1020, small cell 930 to small cell 1030, etc.

Like the system 900, where elements of system 900 are configured to form independent hierarchal or ad-hoc networks, communication device 1020 may form a hierarchal network with small cell 1030 and mobile device 1015, while an additional ad-hoc network may be formed among the small cell 1030 network that includes drone 1017 and some of the devices of the building 1010, such as networked workstations 1040, 1045 and IoT devices 1055, 1060.

Devices in communication system 1000 may also form (D2D) connections with other mobile devices or other elements of the system 1000. For example, the virtual reality device 1050 may form a narrowband IoT connections with other devices, including IoT device 1055 and networked entertainment device 1065. As described above, in some examples, D2D connections may be made using licensed spectrum bands, and such connections may be managed by a cellular network or service provider. Accordingly, while the above example was described in the context of a narrowband IoT, it can be appreciated that other device-to-device connections may be utilized by virtual reality device 1050.

In various examples, the elements of wireless communication system 1000, such as the mobile device 1015, the drone 1017, the communication device 1020, and the small cell 1030, the networked workstations 1040, 1045, the virtual reality device 1050, the IoT devices 1055, 1060, and the networked entertainment device 1065, may be implemented as electronic devices described herein that at least partially compensate for nonlinear power amplifier noise utilizing recurrent neural networks. For example, the communication device 1020 may be implemented as electronic devices described herein, such as electronic device 102, 110 of FIG. 1, electronic device 200 of FIG. 2, recurrent neural network 512 of FIGS. 5C-5E, electronic device 800 of FIG. 8, or any system or combination of the systems depicted in the Figures described herein, such as in conjunction with a time frame 600 of FIG. 6.

Figure 11:
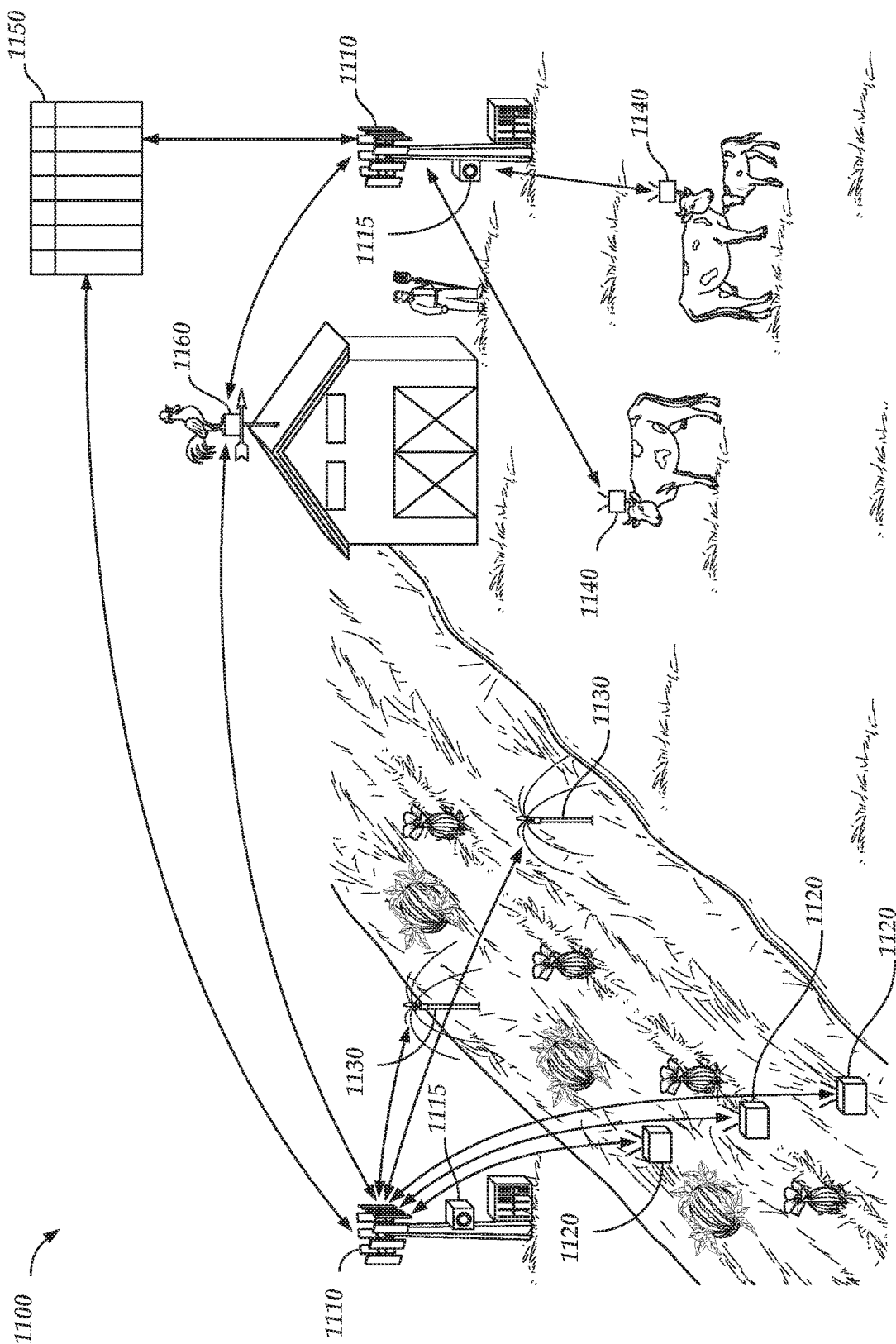
FIG. 11 is a schematic illustration of a wireless communications system arranged in accordance with aspects of the present disclosure.

FIG. 11 illustrates an example of a wireless communication system 1100 in accordance with aspects of the present disclosure. The wireless communication system 1100 includes small cells 1110, camera devices 1115, communication devices 1120, sensor devices 1130, communication devices 1140, data center 1150, and sensor device 1160. In the depicted system 1100, a small cell 1110 may form a hierarchal network, for an agricultural use, with a camera device 1115, communication devices 1120, sensor devices 1130, and sensor device 1160. Such a network formed by small cell 1110 may communicate data sets and inference results among the networked devices and the data center 1150. Continuing in the depicted system 1100, another small cell 1110 may form another hierarchal network, for another agricultural use, with communication devices 1140, data center 1150, and sensor device 1160. Similarly, such a network formed by the additional small cell 1110 may communicate data sets and inference results among the networked devices and the data center 1150. While depicted in certain agricultural networks with particular small cells 1110, it can be appreciated that various networks, whether hierarchal or ad-hoc, may be formed among the devices, cells, or data center of wireless communication system 1100. Additionally or alternatively, like the system 900 or system 1000, it can be appreciated that similarly-named elements of system 1100 may be configured in an analogous way, such as communication device 920 to communication device 1120, communication device 1020 to communication device 1140, or small cell 930 to small cell 1110, etc.

Like the system 1000, devices in system 1100 may also D2D connections with other mobile devices or other elements of the system 1000. For example, the communication device 1140 may form a narrowband IoT connections with other devices, including sensor device 1160 or communication device 1120. As described above, in some examples, D2D connections may be made using licensed spectrum bands, and such connections may be managed by a cellular network or service provider, e.g., a cellular network or service provider of small cell 1110. Accordingly, while the above example was described in the context of a narrowband IoT, it can be appreciated that other device-to-device connections may be utilized by the devices of system 1100.

In various examples, the elements of wireless communication system 1100, such as the camera device 1115, communication devices 1120, sensor devices 1130, communication devices 1140, sensor device 1160, may be implemented as electronic devices described herein that compensate for nonlinear power amplifier noise utilizing recurrent neural networks. For example, the sensor device 1160 may be implemented as electronic devices described herein, such as electronic device 102, 110 of FIG. 1, electronic device 200 of FIG. 2, recurrent neural network 512 of FIGS. 5C-5E, electronic device 800 of FIG. 8, or any system or combination of the systems depicted in the Figures described herein, such as in conjunction with a time frame 600 of FIG. 6. Accordingly, any of the devices of system 1100 may transceive signals on both 4G and 5G bands; while also compensating for nonlinear power amplifier noise utilizing recurrent neural networks.

The wireless communication system 1100 may also be implemented as a 5G wireless communication system, having various mobile or other electronic device endpoints. As an example, the camera device 1115, including a camera (e.g., via an I/O interface 870) may be a mobile endpoint; and communication devices 1120 and sensor devices 1130 may be sensor endpoints in a 5G wireless communication system. Continuing in the example, the camera device 1115 may collect data sets used for training and inference of machine learning or AI techniques at that respective device, e.g., images of watermelons in an agricultural field. Such image data sets may be acquired by the camera device and stored in a memory of the camera device 1115 (e.g., such as memory units 850) to communicate the data sets to the data center 1150 for training or processing inference results based on the image data sets. Using such data sets in an AI technique, the wireless communication system 1100 may determine inference results, such as a prediction of a growth rate of the watermelons based on various stages of growth for different watermelons in the agricultural field, e.g., a full-grown watermelon or an intermediate growth of a watermelon as indicated by a watermelon flower on the watermelon. For example, the data center 1150 may make inference results using a recurrent neural network 840 on a cloud server implementing the electronic device 800, to provide such inference results for use in the wireless communication system 1100.

Continuing in the example of the 5G communication system processing inference results with mobile and/or sensor endpoints, the communication devices 1120 may communicate data sets to the data center 1150 via the small cell 1110. For example, the communication devices 1120 may acquire data sets about a parameter of the soil of the agricultural field in which the watermelons are growing via a sensor included on the respective communication device 1120 (e.g., a sensor 830). Such parameterized data sets may also be stored at the communication device 1120 or communicated to the data center 1150 for further training or processing of inference results using ML or AI techniques. While a status of the agricultural field has been described with respect the example of acquiring data sets about a parameter of the field, it can be appreciated that various data sets about a status of the agricultural field can be acquired, depending on sensors utilized by a communication device 1120 to measure parameters of the agricultural field.

In some implementations, the communication device 1120 may make inference results at the communication device 1120 itself. In such implementations, the communication device 1120 may acquire certain parameterized data sets regarding the soil and make inference results using a recurrent neural network 840 on the communication device 1120 itself. The inference result may be a recommendation regarding an amount of water for the soil of the agricultural field. Based on such an inference result, the communication device 1120 may be further configured to communicate that inference result to another device along with a control instruction for that device. Continuing in the example, the communication device 1120 may obtain such an inference result and generate an instruction for sensor device 1130 to increase or decrease an amount of water according to the inference result. Accordingly, inference results may be processed at devices of system 1100 or at the data center 1150 based on data sets acquired by the various devices of system 1100.

Continuing in the example of the 5G communication system processing inference results with mobile and/or sensor endpoints, the sensor device 1130 may communicate data sets to the data center 1150 via the small cell 1110. For example, the sensor device 1130 may acquire data sets about water usage in the agricultural field in which the watermelons are growing because the sensor device is sprinkler implemented as an electronic device as described herein, such as electronic device 800. For example, the sensor device 1130 may include a sensor 830 that measures water usage, such as a water gauge. Accordingly, the sensor device 1130 may acquire a data set regarding the water usage to be stored at memory units 850 or communicated to a data center 1150 for processing of inference results. Such parameterized data sets may also be stored at the communication device 1120 or communicated to the data center 1150 for further training or processing of inference results using ML or AI techniques. While a status of water usage has been described with respect to the example of a sprinkler and a water gauge, it can be appreciated that various data sets about a status of the water usage can be acquired, depending on sensors utilized by a sensor device 1120 to acquire data sets about water usage.

Additionally or alternatively in the example of the 5G communication system processing inference results, the sensor device 1160 may communicate data sets or make inference results for use by one of the other devices of the system 1100 or the data center 1150. For example, the sensor device 1160 can acquire a dataset regarding a windspeed or other environmental condition of the agricultural setting of system 1100. In the example, the sensor device 1160 may implement the electronic device having a sensor 830 as an anemometer. Accordingly, in the example the sensor 830 may acquire a windspeed and store a data set regarding that wind speed in one or more memory units 850. In some implementations, the sensor device 1160 may utilize the recurrent neural network 840 to make inference results regarding the data set stored in the memory units 850. For example, an inference result may be that a certain wind speed in a particular direction is indicative of precipitation. Accordingly, that inference results may be communicated in a 5G transmission, including while other signals are communicated on a 4G band at the sensor device 1160 or small cell 1110, to the small cell 1110.

In some implementations, the small cell 1110 may further route such an inference result to various devices or the data center 1150. Continuing in the example, the inference result from the sensor device 1160 may be utilized by the sensor devices 1130 to adjust a water usage in the agricultural field. In such a case, the sensor devices 1130 may process the inference results from the sensor device 1130 at a recurrent neural network(s) 840 of the respective sensor devices 1130 to adjust the water usage in the agricultural field growing watermelons based on the inference result that a certain wind speed in a particular direction is indicative of precipitation. Accordingly, advantageously, the system 1100, in acquiring data sets and processing inference results at respective recurrent neural networks 840, may provide a sustainability advantage in conserving certain natural resources that the devices of system 1100 may interact with, such as the sensor devices 1130 interacting with a water natural resource. Using such inference results, the system 1100 can facilitate predictions about natural resources utilized by the agricultural field devices in system 1100.

As another example of the wireless communication systems 1100 implementing a 5G wireless communication system, having various mobile or other electronic device endpoints, another camera device 1115, including a camera (e.g., via an I/O interface 870) and communication devices 1140 attached to certain agricultural livestock (e.g., cows as depicted in FIG. 11) may be additional mobile endpoints; and sensor device 1160 may be a sensor endpoint in a 5G wireless communication system. In the example, the communication devices 1140 may be implemented as certain narrowband IoT devices that may utilize less energy, resulting in power-efficiency and may utilize less complex signaling frameworks, such that devices may transmit asynchronously on particular bands. The I/O interface 870 of the communication devices may be coupled to a Global Positioning System (GPS) device that provides a location of the communication devices 1140 attached to certain agricultural livestock. The respective communication devices 1140 may acquire respective location data sets that track the movement of the livestock in an agricultural field. Advantageously, the communication devices 1140 may provide such data sets to other devices in the system 1100, such as the data center 1150, for further processing of inference results regarding the respective location data sets. Such data sets may be communicated, from the respective communication devices 1140, in a 5G transmission; while other signals are communicated on a 4G band at the communication devices 1140 or small cell 1110, to the small cell 1110.

Continuing in the example, the camera device 1115 may also acquire images of the livestock with the communication devices 1140 attached thereto, for further processing of inference results with the respective location datasets. In an example, the image data sets acquired by the camera device 1115 and the location data sets acquired by the communication devices 1140 may be communicated to the data center 1150 via the small cell 1110. Accordingly, the data center 1150 may make an inference result based on the image and location data sets. For example, a recurrent neural network 840 on a cloud server, implemented as electronic device 800 at the data center 1150, may make an inference result that predicts when the livestock are to be removed from the agricultural field due to a consumption of a natural resource. The inference result may be based on the condition of the agricultural field based on images from the image data set and the temporal location of the livestock indicative of how long the livestock have consumed a particular natural resource (e.g., grass) based on the location data set. In some examples, the cloud server at the data center 1150 (or another cloud server at the data center 1150) may further process that inference result with an additional data set, such as a data set regarding the wind speed acquired by the sensor device 1160, to further process that inference result with an inference result regarding a precipitation prediction based on a certain wind speed in a particular direction. Accordingly, multiple inference results may be processed at the data center 1150 based on various data sets that the devices of system 1100 acquire.

Therefore, the system 1100 may facilitate the acquisition and communication of data sets or inference results for various devices in the system 1100 when implementing such recurrent neural networks as described herein that enable high-capacity training and inference, while also increasing precision of inference results, e.g., including higher-order memory effects in a recurrent neural network 512 of FIGS. 5C-5E. For example, various devices of system 1100 may facilitate processing of data acquired, e.g., to efficiently offload such data to data center 1150 for AI or machine learning (ML) techniques to be applied. Accordingly, the system 1100 may include devices that cancel nonlinear power amplifier noise of one or more devices of the system 1100 that are transceiving on both the 4G or 5G bands, for example, such that other devices that may be operating as 5G standalone transceiver systems can communicate with such 4G/5G devices in an efficient and timely manner.

Figure 12:
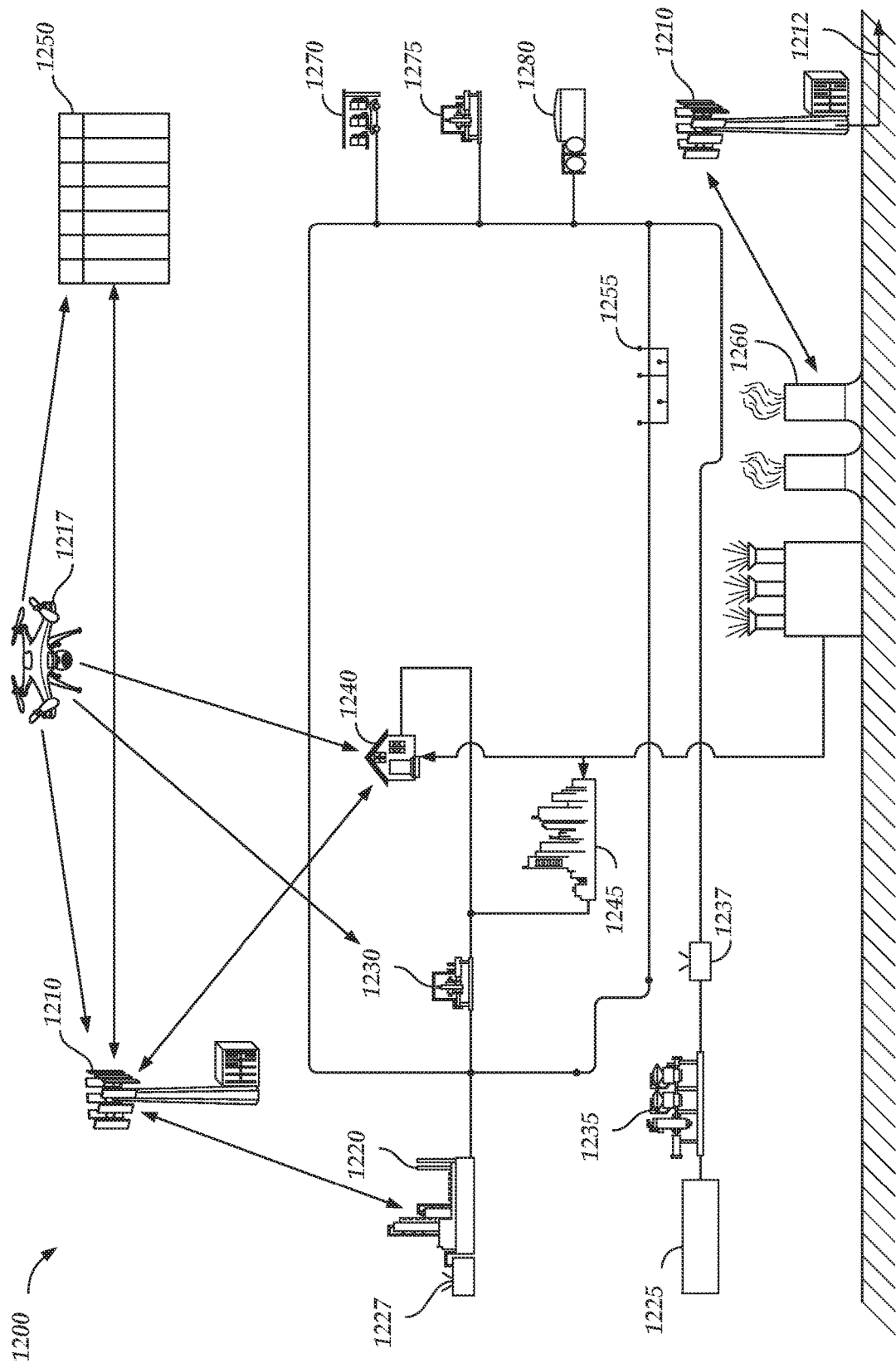
FIG. 12 is a schematic illustration of a communications system arranged in accordance with aspects of the present disclosure.

FIG. 12 illustrates an example of a communication system 1200 in accordance with aspects of the present disclosure. The communication system 1200 includes small cells 1210, wired communication link 1212, drone 1217, industrial user 1220, industrial communication device 1227, substation 1230, industrial pipeline 1225, pipeline receiving station 1235, pipeline communication device 1237, residential user 1240, commercial user 1245, data center 1250, sensor device 1255, power generation user 1260, fuel station 1270, substation 1275, and fuel storage 1280.

In the depicted communication system 1200, small cells 1210 may form a hierarchal network to provide a status of the fuel for various users of the industrial pipeline system, thereby facilitating fuel transmission, distribution, storage, or power generation based on distributed fuel. The fuel may be various types of gas or oil, for example, crude oil, diesel gas, hydrogen gas, or natural gas. The fuel may be provided and utilized by an industrial user 1220, substation 1230 or substation 1275, residential user 1240, commercial user 1245, or fuel station 1270. Various statuses regarding the fuel may be provided to small cells 1210, drone 1217, data center 1250, or wired communication link 1212 by the various communication devices in such an industrial communication system 1200. For example, industrial communication device 1227, pipeline communication device 1237, or sensor device 1255 may provide a status as to a flow of the fuel through the pipeline network depicted in FIG. 12. Additionally or alternatively, the fuel may be provided through the pipeline network for use in power generation at power generation user 1260 or for storage at fuel storage 1280. The fuel is provided to the pipeline network by industrial pipeline 1225 at pipeline receiving station 1235.

As fuel flows through the pipeline network, industrial communication device 1227, pipeline communication device 1237, or sensor device 1255 may be implemented as electronic devices 800 with sensors 830 or I/O interfaces 870 coupled to various I/O devices to receive data input as to a status of the fuel. Accordingly, data sets regarding the fuel may be acquired by the industrial communication device 1227, pipeline communication device 1237, or sensor device 1255 for further processing of inference results regarding a status of the fuel. For example, the pipeline communication device 1237 may communicate via a 5G communications signal a status indicative of power consumption at various users of the pipeline network, such as industrial user 1220, residential user 1240, or commercial user 1245. As another example, substation 1230 or substation 1275 may provide a power generation status as to power generated by elements of pipeline network coupled to the substations 1230 or substation 1275. Accordingly, substation 1230 may provide a power generation status of industrial user 1220; and substation 1275 may provide a power generation status as power generation user 1260. Such various statuses may be provided to the data center 1250 via drone 1217 or small cells 1210 communicating with devices located at the respective users of the pipeline network or devices located at the substations 1230 or 1275. In the implementation of system 1200, a fuel storage status may also be provided to the data center 1250 by the fuel storage 1280.

While system 1200 is depicted in a particular pipeline network system, it can be appreciated that various networks, whether hierarchal or ad-hoc, may be formed among the devices, cells, or data center 1250 of wireless communication system 1200. Additionally or alternatively, like the system 900, system 1000, system 1100, it can be appreciated that similarly-named elements of system 1200 may be configured in an analogous way, such as communication device 920 to pipeline communication device 1237, drone 917 to drone 1217, or small cell 930 to small cell 1210, etc.

Like the system 1100, devices in system 1200 may also D2D connections with other mobile devices or other elements of the system 1200. For example, the pipeline communication device 1237 may form a narrowband IoT connections with other devices, including industrial communication device 1227 or sensor device 1255. As described above, in some examples, D2D connections may be made using licensed spectrum bands, and such connections may be managed by a cellular network or service provider, e.g., a cellular network or service provider of small cell 1210. Accordingly, while the above example was described in the context of a narrowband IoT, it can be appreciated that other device-to-device connections may be utilized by the devices of system 1200.

In various examples, the elements of wireless communication system 1200, such as the industrial communication device 1227, pipeline communication device 1237, or sensor device 1255, may be implemented as electronic devices described herein that compensate for nonlinear power amplifier noise utilizing recurrent neural networks. For example, the sensor device 1255 may be implemented as electronic devices described herein, such as electronic device 102, 110 of FIG. 1, electronic device 200 of FIG. 2, recurrent neural network 512 of FIGS. 5C-5E, electronic device 800 of FIG. 8, or any system or combination of the systems depicted in the Figures described herein, such as in conjunction with a time frame 600 of FIG. 6. Accordingly, any of the devices of system 1200 may transceive signals on both 4G and 5G bands; while also compensating for nonlinear power amplifier noise utilizing recurrent neural networks.

In an example of processing industrially-acquired data sets of the system 1200, the devices of system 1200, such as industrial communication device 1227, pipeline communication device 1237, or sensor device 1255, and users of system 1200 may communicate, via communicated 5G signals, data sets regarding a status of the fuel, power consumption, or power generation, to the data center 1250 for further processing of inference results. In an example, a fuel flow status at sensor device 1255 may be communicated to the data center 1250 via the small cell 1210. As another example, a power consumption status of residential user 1240 may be communicated via a 5G communications signal to the data center 1250 via small cell 1210 or drone 1217. As yet another example, a power generation status may be communicated via a 5G communications signal to the small cell 1210 from power generation user 1260, and then further communicated to the data center 1250 via a wired communication link 1212. Accordingly, the data center 1250 may acquire data sets from various communication devices or users of system 1200. The data center may process one or more inference results based on such acquired data sets. For example, a recurrent neural network 840 on a cloud server, implemented as electronic device 800 at the data center 1250, may make an inference result that predicts when a fuel shortage or surplus may occur based on a power consumption status at various users of the system 1200 and a fuel flow status received from pipeline communication device 1237 detecting a fuel flow from pipeline 1225 via pipeline receiving station 1235. In some examples, the cloud server at the data center 1250 (or another cloud server at the data center 1250) may further process that inference result with one or more additional data sets, to further process that inference result with one or more other inference results. Accordingly, multiple inference results may be processed at the data center 1250 based on various data sets that the devices of system 1200 acquire. Therefore, the devices of system 1200 may facilitate processing of data acquired, e.g., to efficiently offload such data to data center 1250 for AI or machine learning (ML) techniques to be applied.

Accordingly, the system 1200 may facilitate the acquisition and communication of data sets or inference results for various devices in the system 1200 when implementing such recurrent neural networks as described herein that enable higher-capacity training and inference, while also increasing precision of inference results, e.g., including higher-order memory effects in a recurrent neural network 512 of FIGS. 5C-5E. Accordingly, the system 1200 may include devices that cancel nonlinear power amplifier noise of one or more devices of the system 1200 that are transceiving on both the 4G or 5G bands, for example, such that other devices that may be operating as 5G standalone transceiver systems can communicate with such 4G/5G devices in an efficient and timely manner.

Moreover, such 5G standalone systems may be preferable to operate in a remote setting, e.g., not near a city with a wireless metropolitan access network (MAN)). Such 5G systems can operate over greater distances (e.g., 1 km, 5 km, 50 km, 500 km, or 5000 km); in contrast to a metropolitan-geographic area, which may be restricted to smaller distances (e.g., 10 m, 100 m, 1 km, or 5 km). Accordingly, a 5G transceiver system may need to communicate long distances in an environment with various degrading environmental effects. Therefore, the 5G systems and devices described herein can communicate data in wireless environments that experience effects of weather conditions over great distances and/or other environmental effects to the wireless environment.

On top of the challenges of environmental effects and distance, the transceiver system may experience interference. For example, in contrast to a conventional wireless MAN system that may have a line-of-sight (LOS) with a wireless subscriber, a 5G wireless system may include a data center communicating with a remote agricultural device that is experiencing cloudy weather in a temperate environment (e.g., the Puget Sound region). As such, the remote agricultural device may not have a direct LOS with the data center because the LOS is occluded by clouds or other environmental factors. In such a case, examples described herein may compensate for interference generated by other antennas or nonlinear power amplifiers co-located on the same physical device or system; as well as compensating for the environmental effects that a 5G communication signal may experience due to its communication path over a greater distance than that of a wireless MAN.

In compensating or reducing nonlinear power amplifier noise using RNNs, wireless systems and devices described herein may increase capacity of their respective communication networks, with such systems being more invariant to noise than traditional wireless systems that do not use RNNs (e.g., utilizing time-delayed versions of processing results). For example, the recurrent neural networks may be used to reduce nonlinear power amplifier noise that will be present in transmitted signals (e.g., amplified signals from a power amplifier of a wireless transceiver) based partly on the signals to be transmitted, e.g., in filtering transmission signals at a digital filter (e.g., DPD filter 220), prior to amplifying the transmission signals at a power amplifier 240. For example, using time-delayed versions of processing results in an RNNs, the nonlinear power amplifier noise created by power amplifiers may be compensated or reduced, as the RNN utilizes feedback signals X(n) 277 with respect to the time-delayed versions of the input data (e.g., power amplifier output data), to generate filter coefficient data as output data from the RNN. In this manner, recurrent neural networks may be used to reduce and/or improve errors which may be introduced by such nonlinear power amplifier noise. Advantageously, with such an implementation, wireless systems and devices implementing such RNNs increase capacity of their respective wireless networks because additional data may be transmitted in such networks, which would not otherwise be transmitted due to the effects of nonlinear power amplifier noise, e.g., which limits the amount of data to be transmitted due to compensation schemes in traditional wireless systems.

As an additional or alternative advantage, a power amplifier, in a standalone 5G transceiver that may be preferable to operate in a remote setting, may amplify wireless transmission signals at higher amplification rates (e.g., to operate over greater distances of 5 km, 50 km, 500 km, or 5000 km). Accordingly, a 5G transceiver system may need to communicate long distances in an environment with various degrading environmental effects. The 5G systems and devices described herein can communicate data in wireless environments that experience effects of weather conditions over great distances and/or other environmental effects to the wireless environment, while also compensating for such nonlinear power amplifier noise by providing filter coefficient data from a recurrent neural network to a DPD filter. For example, the recurrent neural network 280 may calculate or generate filter coefficient data as a dataset, which would be difficult to model, without the utilization of the RNNs described herein. In some implementations, large datasets of filter coefficient data may be utilized by the DPD filter to compensate such nonlinear power amplifier noise, while also transmitting in an environment with degrading environmental effects. Accordingly, a wireless device or system that implements a NN or RNN, as described herein, may calculate filter coefficient data representative of nonlinear power amplifier noise, such as those involved in processing wireless input data having time-varying wireless channels (e.g., autonomous vehicular networks, drone networks, or Internet-of-Things (IoT) networks).

Certain details are set forth above to provide a sufficient understanding of described examples. However, it will be clear to one skilled in the art that examples may be practiced without various of these particular details. The description herein, in connection with the appended drawings, describes example configurations and does not represent all the examples that may be implemented or that are within the scope of the claims. The terms "exemplary" and "example" as may be used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Techniques described herein may be used for various wireless communications systems, which may include multiple access cellular communication systems, and which may employ code division multiple access (CDMA), time division multiple access (TDMA), frequency division multiple access (FDMA), orthogonal frequency division multiple access (OFDMA), or single carrier frequency division multiple access (SC-FDMA), or any a combination of such techniques. Some of these techniques have been adopted in or relate to standardized wireless communication protocols by organizations such as Third Generation Partnership Project (3GPP), Third Generation Partnership Project 2 (3GPP2) and IEEE. These wireless standards include Ultra Mobile Broadband (UMB), Universal Mobile Telecommunications System (UMTS), Long Term Evolution (LTE), LTE-Advanced (LTE-A), LTE-A Pro, New Radio (NR), IEEE 802.11 (WiFi), and IEEE 802.16 (WiMAX), among others.

The terms "5G" or "5G communications system" may refer to systems that operate according to standardized protocols developed or discussed after, for example, LTE Releases 13 or 14 or WiMAX 802.16e-2005 by their respective sponsoring organizations. The features described herein may be employed in systems configured according to other generations of wireless communication systems, including those configured according to the standards described above.

The various illustrative blocks and modules described in connection with the disclosure herein may be implemented or performed with a general-purpose processor, a digital signal processor (DSP), an application-specific integrated circuit (ASIC), a field-programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing it will be appreciated that, although specific examples have been described herein for purposes of illustration, various modifications may be made while remaining with the scope of the claimed technology. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a transceiver configured to generate, using a power amplifier, a plurality of radio frequency (RF) signals for transmission;
   a plurality of multiplication/accumulation units (MAC units), including:
      first MAC units of the plurality of MAC units configured to mix the plurality of RF signals received via a receive path of the transceiver as feedback and signaling that is based on respective outputs of the first MAC units using a plurality of coefficients to generate first intermediate processing results; and
      additional MAC units of the plurality of MAC units, the additional MAC units configured to mix the first intermediate processing results and signaling that is based on respective outputs of the respective additional MAC units using additional coefficients of the plurality of coefficients to generate filter coefficient data; and
   a digital filter configured to filter signals prior to an input to the power amplifier in accordance with the filter coefficient data calculated using the plurality of MAC units.

2. The apparatus of claim 1, wherein the digital filter is further configured to provide output data as a compensated plurality of RF signals, the output data based partly on the filter coefficient data.

3. The apparatus of claim 1, wherein a recurrent neural network (RNN) is configured to provide the filter coefficient data to the digital filter.

4. The apparatus of claim 3, wherein the RNN is configured receive the plurality of RF signals as feedback via the receive path of the transceiver.

5. The apparatus of claim 1, further comprising:
   a switch coupled to the transceiver and configured to:
      activate a switch path that provides the plurality of RF signals as the feedback from a transmit path of the transceiver via the receive path of the transceiver.

6. The apparatus of claim 5, wherein the switch is further configured to:
   receive a selection signal indicating whether the switch path is to be activated, the selection signal based at least in part on a transmission time interval (TTI) of a time-division duplex (TDD) configured radio frame.

7. The apparatus of claim 6, wherein the selection signal indicating the switch path is to be activated is based at least in part on an uplink TTI of the TDD configured radio frame.

8. The apparatus of claim 6, wherein the selection signal indicating the switch path is to be deactivated is based at least in part on a downlink TTI of the TDD configured radio frame.

9. The apparatus of claim 6, wherein the selection signal is based at least in part on an uplink TTI of the TDD configured radio frame or a downlink TTI of the TDD configured radio frame.

10. The apparatus of claim 6, wherein the switch is further configured to, responsive to the selection signal indicating the switch path is to be activated, activate the switch path that provides feedback via the receive path of the transceiver, and
    wherein the receive path of the transceiver is coupled to the transmit path of the transceiver when the switch path is activated.

11. The apparatus of claim 6, wherein the switch is further configured to deactivate the switch path responsive to the selection signal indicating the switch path is to be deactivated.

12. The apparatus of claim 1, wherein the plurality of RF signals include data indicative of at least one of a livestock status, a water usage status, an agricultural field status, a wind measurement, a power generation status, an oil flow status, an energy storage status, or a power consumption status.

13. An apparatus, comprising:
    a plurality of transceivers each configured to provide a respective signal of a plurality of signals to a respective antenna of a plurality of antennas;
    a plurality of power amplifiers configured to receive respective signals and to amplify the respective signals to generate respective amplified signals that each include a portion of nonlinear power amplifier noise;

a processor comprising a recurrent neural network (RNN) configured to generate filter coefficient data according to the respective amplified signals; and a filter configured to filter signals at an input to the plurality of power amplifiers in accordance with the filter coefficient data.

14. The apparatus of claim 13, wherein the RNN comprising:

a plurality of processing units configured for bit manipulation and configured to receive the respective amplified signals; and a plurality of multiplication/accumulation (MAC) units, each MAC unit configured to generate a plurality of noise processing results based on the respective amplified signal and a delayed version of at least one of the plurality of noise processing results.

15. The apparatus of claim 14, wherein the RNN further comprising:

a plurality of memory look-up units (MLUs) configured to store and provide respective noise processing results, wherein a portion of the plurality of the MLUs configured to provide output data based on the respective amplified signals being mixed using a plurality of coefficients.

16. The apparatus of claim 15, further comprising:

a plurality of delay units, each delay unit associated with a respective MAC unit and configured to provide the delayed versions of respective outputs of the plurality of MAC units based on a portion of the respective noise processing results provided by respective MLUs of the plurality of MLUs.

17. The apparatus of claim 13, further comprising:

a plurality of switches, each switch configured to:

activate a respective switch path that provides the respective amplified signal from a respective transmit path of a respective transceiver to the RNN via a receive path of that transceiver or via a respective receive path of a respective transceiver of the plurality of transceivers.

18. The apparatus of claim 13, wherein the apparatus implements an Internet-of-Things (IoT) smart home device, an IoT agricultural device or an IoT industrial device.

19. A method, comprising:

generating, in a transmit path of a transceiver, a first transmission signal based partly on a first input signal to be transmitted, wherein generating the transmission signal comprises amplifying the first transmission signal using a power amplifier;

providing, after activating a switch path, the first transmission signal as feedback from the transmit path of a transceiver to a recurrent neural network (RNN) via a receive path of the transceiver;

mixing, at the RNN, the feedback as input data using a plurality of coefficients and additional plurality of coefficients, wherein mixing the input data comprises:

calculating first processing results based on the input data and delayed versions of respective outputs of a first plurality of multiplication/accumulation processing units (MAC units) with the plurality of coefficients; and calculating output data based on the first processing results and delayed versions of respective outputs of a respective additional plurality of MAC units with the additional plurality of coefficients; and filtering a second transmission signal in accordance with the output data, prior to amplifying the second transmission signal using the power amplifier.

20. The method of claim 19, further comprising:

activating the switch path based at least in part on receiving a selection signal; and receiving the selection signal that indicates the switch path is to be activated when a transmission time interval (TTI) of a time-division duplex (TDD) configured radio frame is designated for an uplink transmission.

21. The method of claim 20, further comprising, when the switch path is activated, coupling the receive path of the transceiver to the transmit path of the transceiver.

22. The method of claim 19, further comprising:

providing, from the RNN, the output data as filter coefficient data to the digital filter that at least partially compensates nonlinear power amplifier noise in transmission signals.

* * * * *